(12) United States Patent
Liaw

(10) Patent No.: US 11,855,094 B2
(45) Date of Patent: Dec. 26, 2023

(54) FINFET DEVICES WITH DUMMY FINS HAVING MULTIPLE DIELECTRIC LAYERS

(71) Applicant: Taiwan Semiconductor Manufacturing Co., Ltd., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 17/688,146

(22) Filed: Mar. 7, 2022

(65) Prior Publication Data

US 2022/0189956 A1   Jun. 16, 2022

Related U.S. Application Data

(63) Continuation of application No. 16/721,220, filed on Dec. 19, 2019, now Pat. No. 11,270,996, which is a
(Continued)

(51) Int. Cl.
| | |
|---|---|
| *H01L 27/092* | (2006.01) |
| *H01L 29/06* | (2006.01) |
| *H01L 27/02* | (2006.01) |
| *H01L 29/08* | (2006.01) |
| *H01L 21/8238* | (2006.01) |
| *H01L 21/027* | (2006.01) |

(52) U.S. Cl.
CPC ...... *H01L 27/0924* (2013.01); *H01L 27/0207* (2013.01); *H01L 29/0653* (2013.01); *H01L 29/0696* (2013.01); *H01L 21/0274* (2013.01); *H01L 21/823821* (2013.01); *H01L 21/823878* (2013.01); *H01L 29/0847* (2013.01)

(58) Field of Classification Search
CPC ........ H01L 21/823878; H01L 27/0886; H01L 29/66545; H01L 29/0649; H01L 21/823487; H01L 29/785; H01L 21/823821; H01L 29/66795
See application file for complete search history.

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |
| | (Continued) | |

*Primary Examiner* — Brian Turner
(74) *Attorney, Agent, or Firm* — HAYNES AND BOONE, LLP

(57) ABSTRACT

A semiconductor device includes a substrate; semiconductor fins over the substrate and oriented lengthwise along a first direction; first multi-dielectric-layer (MDL) fins and second MDL fins over the substrate and oriented lengthwise along the first direction, wherein the first and the second MDL fins are intermixed with the semiconductor fins, wherein each of the first MDL fins and the second MDL fins includes an outer dielectric layer and an inner dielectric layer, wherein the outer dielectric layer and the inner dielectric layer have different dielectric materials; and gate structures oriented lengthwise along a second direction generally perpendicular to the first direction, wherein the gate structures are spaced from each other along the first direction, and are separated by the first MDL fins along the second direction, wherein the gate structures engage the semiconductor fins and the second MDL fins.

20 Claims, 30 Drawing Sheets

Related U.S. Application Data continuation of application No. 15/958,542, filed on Apr. 20, 2018, now Pat. No. 10,522,546.

(56) References Cited

U.S. PATENT DOCUMENTS

| | | | |
|---|---|---|---|
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,412,695 B1* | 8/2016 | Xie | H01L 21/823431 |
| 9,520,482 B1 | 12/2016 | Chang et al. | |
| 9,576,814 B2 | 2/2017 | Wu et al. | |
| 9,653,602 B1* | 5/2017 | Cheng | H01L 21/823885 |
| 9,859,166 B1* | 1/2018 | Cheng | H01L 29/7851 |
| 2007/0190742 A1 | 8/2007 | Chou et al. | |
| 2013/0164910 A1 | 6/2013 | Anderson et al. | |
| 2014/0252486 A1* | 9/2014 | Lin | H01L 29/401 257/365 |
| 2015/0021709 A1 | 1/2015 | Jacob et al. | |
| 2016/0020210 A1 | 1/2016 | Liaw | |
| 2016/0093614 A1 | 3/2016 | Cheng et al. | |
| 2016/0133632 A1 | 5/2016 | Park et al. | |
| 2016/0225906 A1* | 8/2016 | Wang | H01L 21/324 |
| 2016/0225908 A1 | 8/2016 | Wang | |
| 2016/0300949 A1 | 10/2016 | Lee et al. | |
| 2017/0033107 A1 | 2/2017 | Hong | |
| 2017/0053915 A1 | 2/2017 | Ando | |
| 2017/0133379 A1* | 5/2017 | Kim | H01L 29/66545 |
| 2017/0141111 A1 | 5/2017 | Deng | |
| 2017/0178976 A1 | 6/2017 | Kanakasabapathy | |
| 2018/0069000 A1* | 3/2018 | Bergendahl | H01L 29/785 |
| 2019/0067445 A1 | 2/2019 | Ching | |
| 2019/0139957 A1 | 5/2019 | Liao et al. | |
| 2019/0140080 A1 | 5/2019 | Lee | H01L 29/0847 |

\* cited by examiner

US 11,855,094 B2

FINFET DEVICES WITH DUMMY FINS HAVING MULTIPLE DIELECTRIC LAYERS

PRIORITY

This application is a continuation of U.S. patent application Ser. No. 16/721,220, filed Dec. 19, 2019, which is a continuation of U.S. patent application Ser. No. 15/958,542, filed Apr. 20, 2018 and issued as U.S. Pat. No. 10,522,546 on Dec. 31, 2019, each of which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, in FinFET fabrication processes, it has become challenging to continually increase fin density and decrease fin geometry while providing high circuit performance. On the one hand, the market demands higher device integration, which means more FinFETs (hence, more fins) per unit wafer area. This leads to very narrow fin-to-fin space between adjacent FinFETs. On the other hand, the narrow fin-to-fin space limits the growth of S/D epitaxial features in order to prevent accidental shorting of the S/D features. When S/D epitaxial features become smaller, there is less landing area for S/D contacts, thus leading to increased S/D contact resistance. Furthermore, narrow fin-to-fin space also increases coupling capacitance between adjacent gate structures. Both the increased S/D contact resistance and the increased coupling capacitance adversely impact the device performance. Accordingly, improvements in these areas of FinFET fabrication are desirable.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
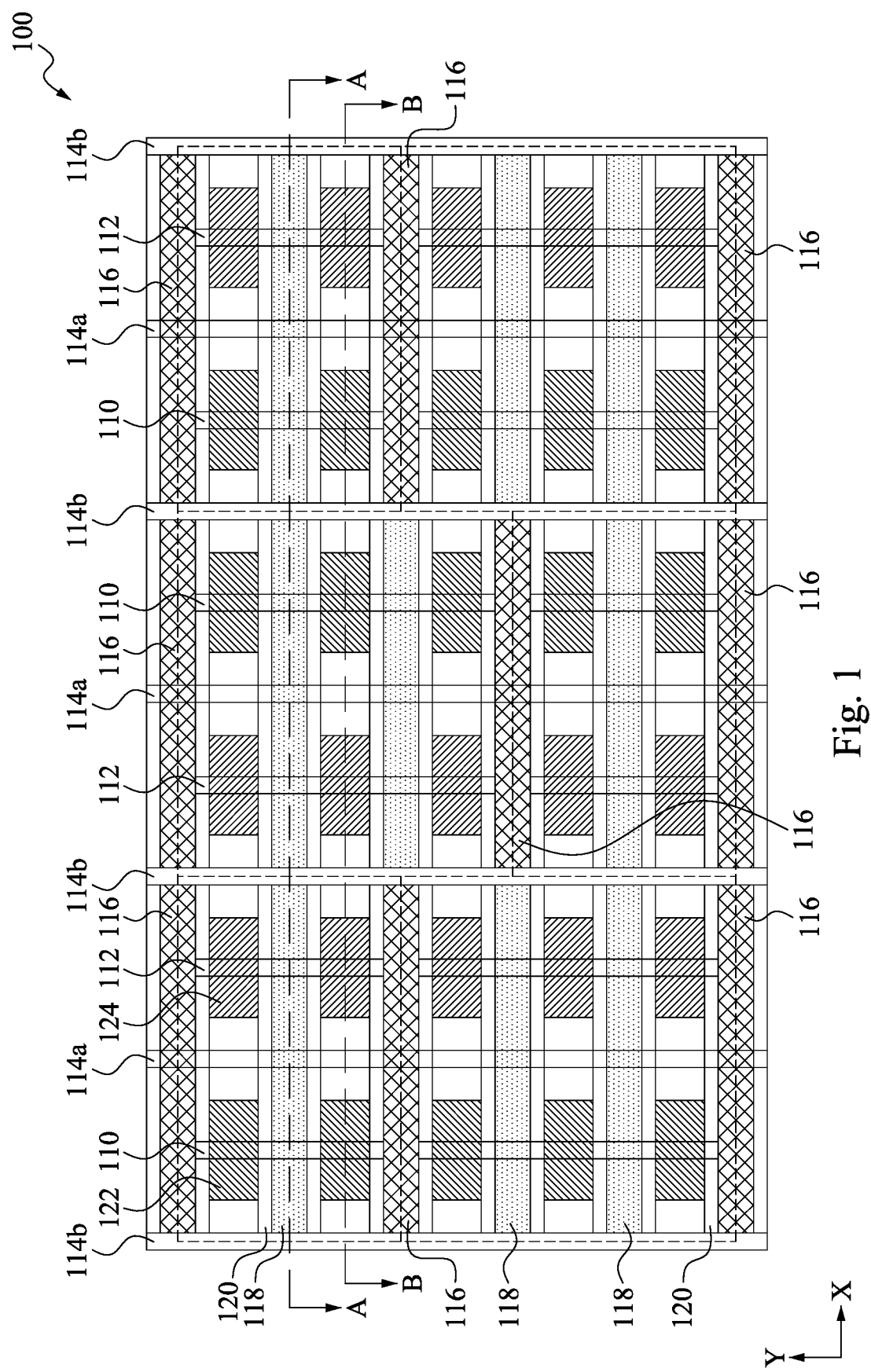
FIGS. 1 and 2 are top views of a portion of a semiconductor device, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and methods of forming the same. More particularly, the present disclosure is related to fin isolation structures. An object of the present disclosure is to provide dielectric fins between adjacent semiconductor fins for isolation purposes (e.g., isolating adjacent semiconductor fins as well as isolating adjacent S/D epitaxial features). Specifically, each dielectric fin includes multiple dielectric layers, and is referred to as a multi-dielectric-layer (MDL) fin. The MDL fin includes a first dielectric layer having a first dielectric material, and a second dielectric layer having a second dielectric material, wherein the first and the second dielectric materials have different dielectric constants. For example, one of the first and the second dielectric materials has a dielectric constant equal to or less than 5, and the other one of the dielectric materials has a dielectric constant equal to or greater than 7. The lower-dielectric-constant material helps reduce coupling capacitance between adjacent gate structures (and between adjacent semiconductor fins). The higher-dielectric-constant material provides higher etch selectivity in subsequent etching processes and maintains its height so that the MDL fins can effectively isolate adjacent S/D epitaxial features. These and other benefits of the MDL fins will be discussed in more detail below. In some embodiments, the MDL fins may include more than two dielectric layers.

The various accompanying figures (FIGS. 1-30) show top and cross-sectional views of a portion of a semiconductor device 100 in various embodiments, according to aspects of the present disclosure. The device (or structure) 100 is provided for illustration purposes and does not necessarily limit the embodiments of the present disclosure to any number of transistors, any number of regions, or any configuration of structures or regions. Furthermore, the device 100 may be an IC, or a portion thereof, that may comprise static random access memory (SRAM) and/or standard logic circuits, passive components such as resistors, capacitors, and inductors, and active components such as p-type field effect transistors (PFETs), n-type FETs (NFETs), multi-gate FETs such as FinFETs and gate all-around (GAA) FETs, metal-oxide semiconductor field effect transistors (MOSFETs), complementary metal-oxide semiconductor (CMOS) FETs, bipolar transistors, high voltage transistors, high frequency transistors, other memory cells, and combinations thereof.

Figure 3:
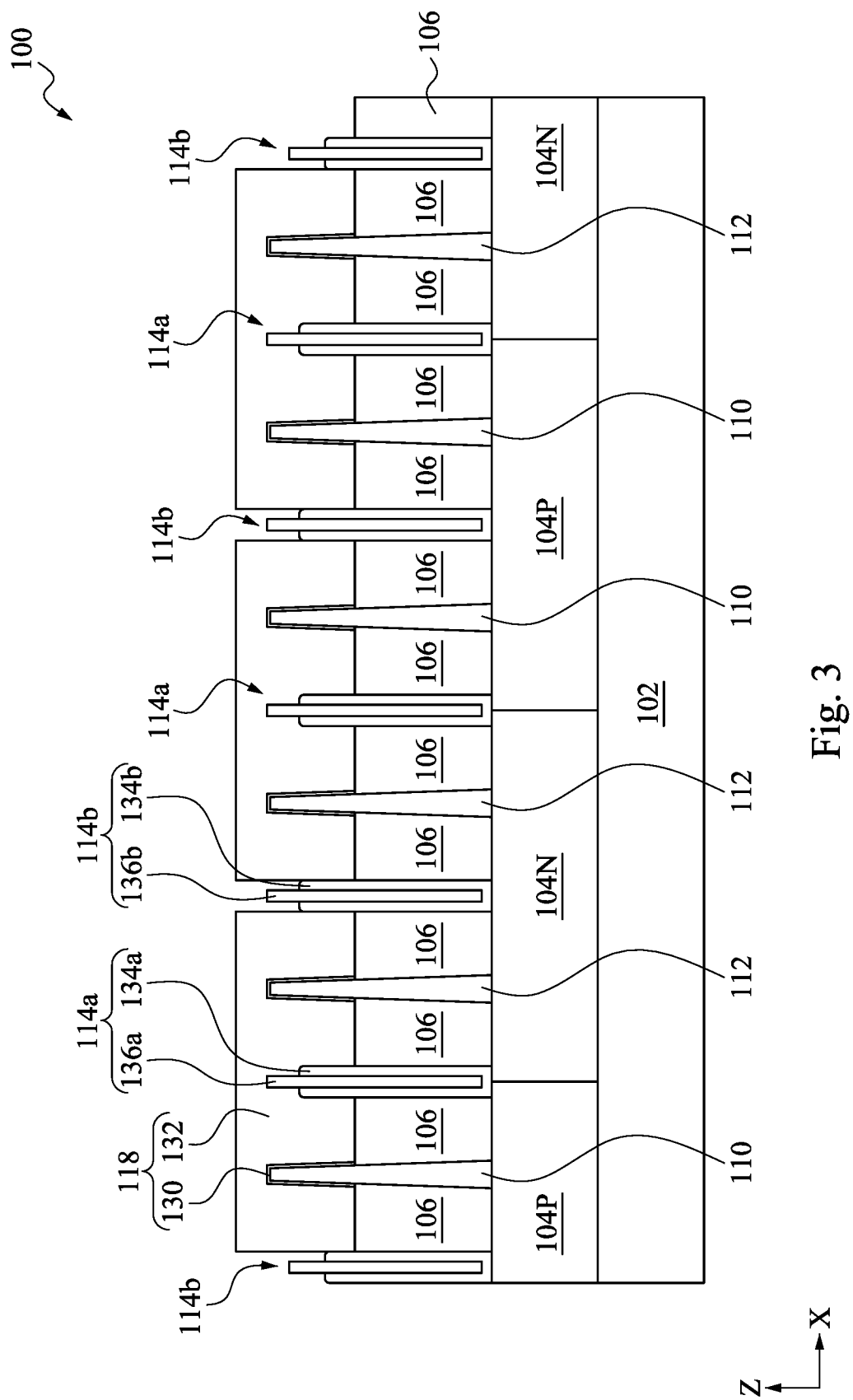
FIGS. 3 and 4 are cross-sectional views of the portion of the semiconductor device in FIG. 1 (or FIG. 2) along the A-A and B-B lines of FIG. 1 (or FIG. 2), respectively, according to some embodiments of the present disclosure.
Figure 4:
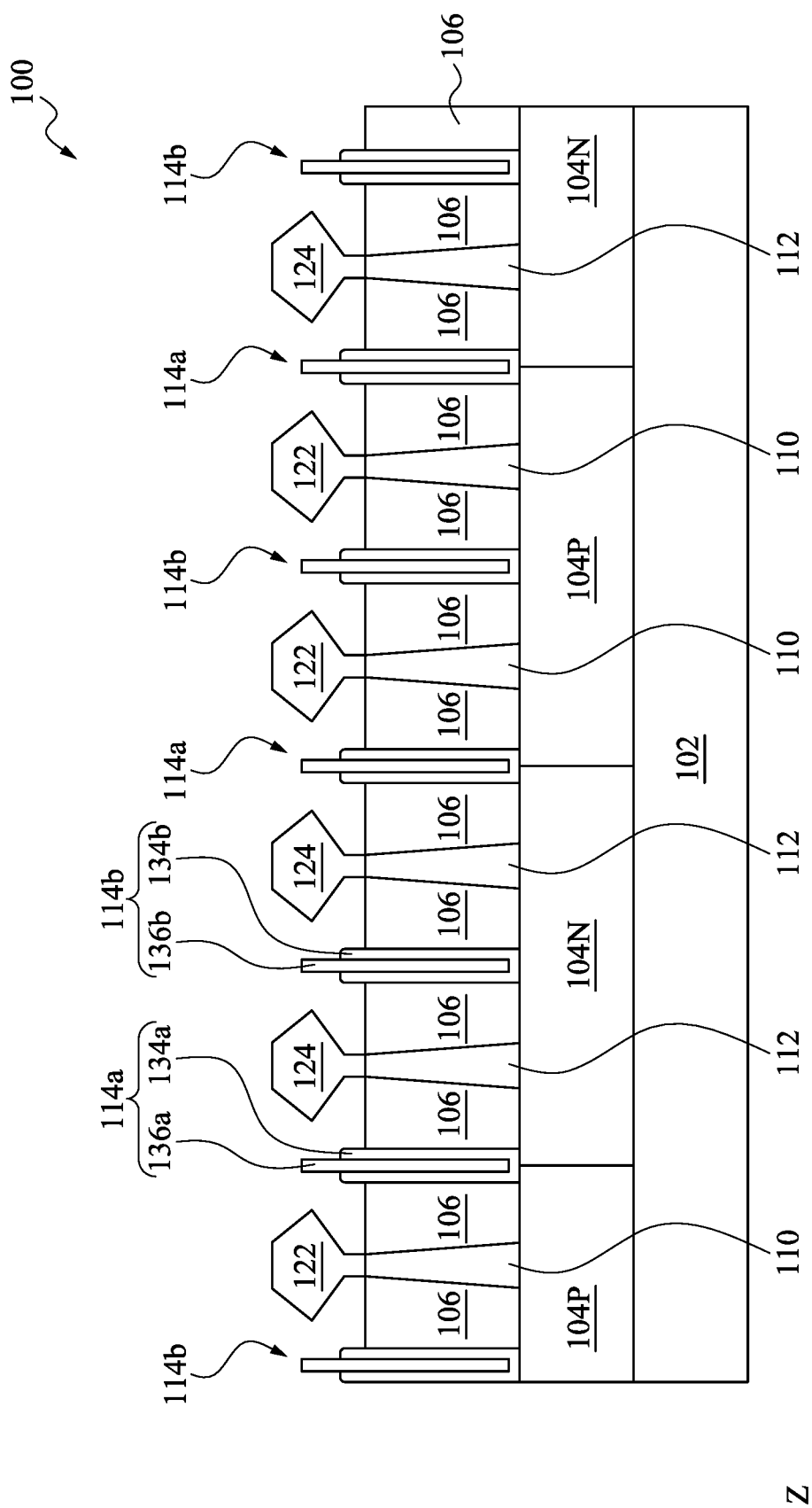

FIG. 1 shows a top view of the device 100, and FIGS. 3 and 4 show cross-sectional views of the device 100 along the A-A and B-B lines of FIG. 1, respectively. Referring to FIGS. 1, 3, and 4 collectively, the device 100 includes a substrate 102 and multiple cells (or devices) formed over the substrate 102. Each of the cells includes CMOS FinFETs and may perform a standard logic function such as INV, AND, OR, NAND, NOR, and D flip-flop. Therefore, each cell may also be referred to as a CMOS cell or a standard logic cell. The boundary of the cells is defined by isolation structures 116 and MDL fins 114b from the top view. The isolation structures 116 are oriented lengthwise along the X direction and the MDL fins 114b are oriented lengthwise along the Y direction. Therefore, each cell has a rectangular shape from the top view, which simplifies the layout of the device 100.

Referring to FIGS. 1 and 3, multiple active regions (e.g., wells) 104P and 104N are defined in the substrate 102. The active regions 104P are of P-conductivity type (e.g., doped with p-type impurities such as boron), and are suitable for forming NMOSFETs (e.g., n-type FinFETs). The active regions 104N are of N-conductivity type (e.g., doped with n-type impurities such as phosphorous), and are suitable for forming PMOSFETs (e.g., p-type FinFETs). The device 100 further includes semiconductor fins 110 and 112. The semiconductor fins 110 are of P-conductivity type and are suitable for forming n-type FinFETs, and the semiconductor fins 112 are of N-conductivity type and are suitable for forming p-type FinFETs. Each cell includes at least one semiconductor fin 110 and at least one semiconductor fin 112 to make up one or more CMOSFETs therein.

The device 100 further includes MDL fins 114a and 114b. The semiconductor fins 110 and 112 and the MDL fins 114a and 114b are oriented lengthwise along the Y direction, and are spaced from each other along the X direction. The MDL fins 114a and 114b are intermixed with the semiconductor fins 110 and 112 for isolating the semiconductor fins 110 and 112. Particularly, each of the MDL fins 114a includes a dielectric layer 134a and another dielectric layer 136a. The dielectric material(s) of the dielectric layer 134a has a lower dielectric constant than the dielectric material(s) of the dielectric layer 136a in the present embodiment. Similarly, each of the MDL fins 114b includes a dielectric layer 134b and another dielectric layer 136b. The dielectric material(s) of the dielectric layer 134b has a lower dielectric constant than the dielectric material(s) of the dielectric layer 136b in the present embodiment. The top surface of the dielectric layer 136a is higher than the top surface of the dielectric layer 136b in this view. The top surface of the dielectric layer 134a is higher than the top surface of the dielectric layer 134b in this view. The materials and the configuration of the MDL fins 114a and 114b will be further discussed in later sections of the present disclosure.

The device 100 further includes an isolation structure 106 over the substrate 102. The semiconductor fins 110 and 112 and the MDL fins 114a and 114b are partially embedded in the isolation structure 106. Referring to FIG. 1, the device 100 further includes dielectric isolation structures 116 and gate structures 118, which are oriented lengthwise along the X direction, and are spaced from each other along the Y direction. Particularly, the features 116 and 118 are separated by the MDL fins 114b along the X direction. The isolation structure 116 may include silicon oxide, silicon nitride, silicon oxynitride, fluoride-doped silicate glass (FSG), a low-k dielectric material, and/or other suitable insulating material. The gate structures 118 may be high-k metal gates in an embodiment. The gate structures 118 engage the semiconductor fins 110 and 112 in each cell to form Fin-FETs. The gate structures 118 are also disposed over the MDL fins 114a. The semiconductor fins 110 and 112 are separated by the dielectric isolation structures 116 along the Y direction. The device 100 further includes gate spacers 120 over sidewalls of the gate structures 118 and over sidewalls of the isolation structures 116.

Referring to FIGS. 1 and 4, the device 100 further includes S/D epitaxial features 122 and 124 over the semiconductor fins 110 and 112, respectively. The S/D epitaxial features 122 and 124 are disposed on opposite sides of the respective gate structures 118. In the present embodiment, the S/D epitaxial features 122 and 124 are doped with n-type dopants and p-type dopants, respectively. Adjacent S/D epitaxial features 122 and 124 are separated by the MDL fins 114a and 114b. Particularly, the dielectric layers 136a and 136b in the MDL fins 114a and 114b are high enough to prevent nearby S/D epitaxial features 122 and 124 from merging with each other. The dielectric layers 136a and 136b in this view have about the same height. The dielectric layers 134a and 134b in this view have about the same height.

Figure 2:
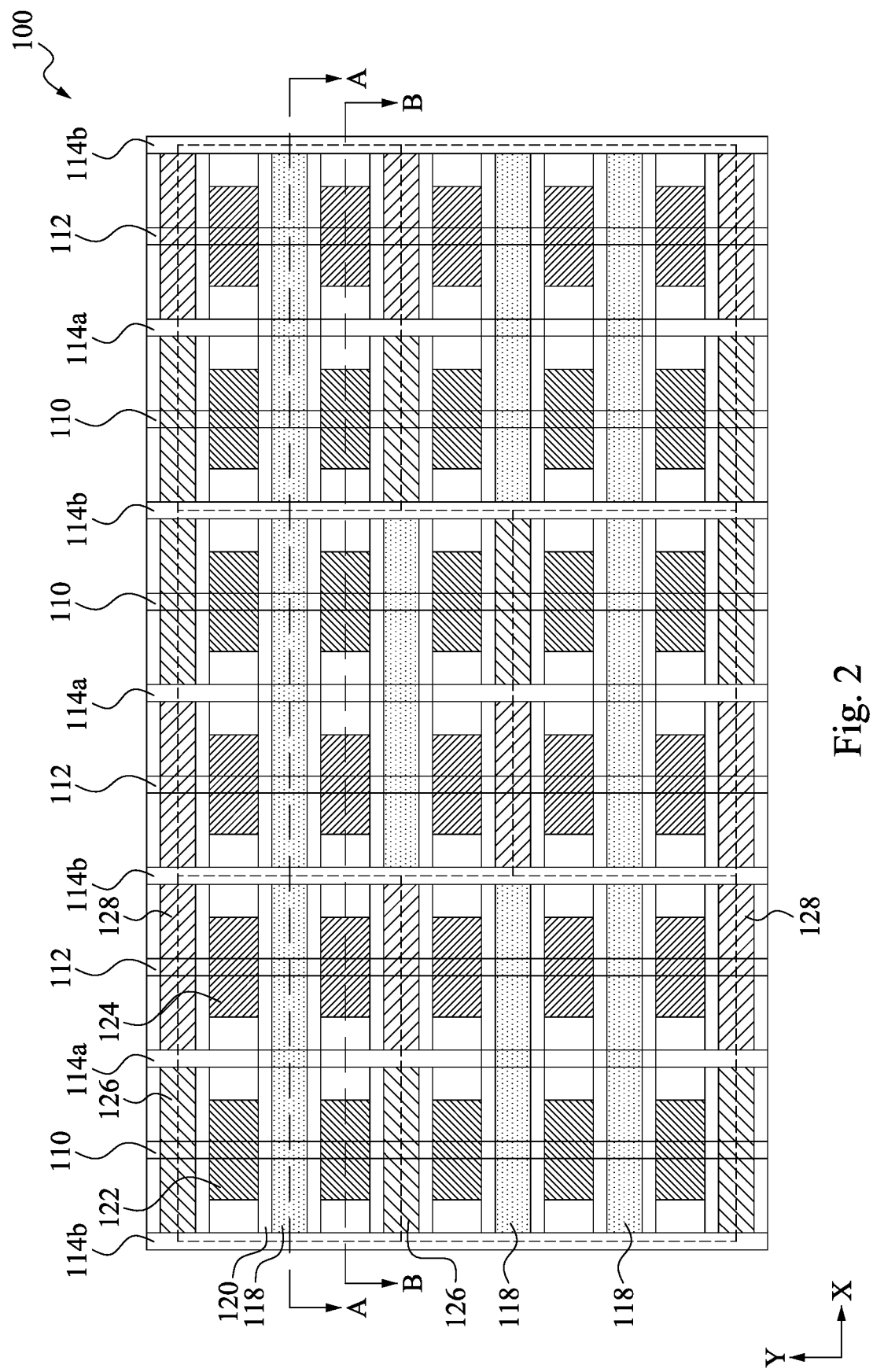

FIG. 2 shows a top view of the device 100 according to another embodiment of the present disclosure. The device 100 in this embodiment is substantially the same as the device 100 in FIG. 1 with two differences. The first difference is that the semiconductor fins 110 and 112 are not broken at the standard cell boundary in this embodiment, but extend continuously through multiple cells. The second difference is that the isolation structures 116 are replaced by gate structures 126 and 128 in this embodiment. The gate structures 126 and 128 may have the same materials and configuration as the gate structures 118, but are tied to constant low voltage (e.g., GND) and constant high voltage (e.g., Vdd), respectively. The FinFETs associated with the gate structures 126 and 128 become inactive and act as isolation MOSFETs at the cell boundary. The cross-sectional views of the device 100 in this embodiment along the A-A line and the B-B line of FIG. 2 are the same as those shown in FIGS. 3 and 4, respectively.

The device 100 may further include other components not shown in FIGS. 1-4, such as an etch stop layer over the S/D epitaxial layers 122 and 124, pre-metallization dielectric (PMD) layer(s), interlayer dielectric (ILD) layers, vias and contacts, and metal lines for connecting various cells in the IC.

The various components of the device 100 are further described below. The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor-on-insulator (SOI) such as having a buried dielectric layer.

The semiconductor fins 110 and 112 may include one or more semiconductor materials such as silicon, germanium, or silicon germanium. In an embodiment, each of the semiconductor fins 110 and 112 may include multiple different semiconductor layers stacked one over the other. The semiconductor fins 110 and 112 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor fins 110 and 112 by etching initial epitaxial semiconductor layers of the substrate 102. The etching process can include dry etching, wet etching, reactive ion etching (RIE), and/or other suitable processes. The semiconductor fins 110 and 112 may be doped with proper dopants as discussed above.

The isolation structure 106 may include silicon oxide, silicon nitride, silicon oxynitride, fluoride-doped silicate glass (FSG), a low-k dielectric material, and/or other suitable insulating material. The isolation structure 106 may be shallow trench isolation (STI) features. In an embodiment, the isolation structure 106 is formed by etching trenches in the substrate 102, e.g., as part of the fins 110 and 112 formation process. The trenches may then be filled with isolating material, followed by a chemical mechanical planarization (CMP) process and/or an etch-back process. In another embodiment, the isolation structure 106 is formed by depositing a dielectric material over the sidewalls of the semiconductor fins 110 and 112 without fully filling the trenches between the semiconductor fins 110 and 112. In other words, the isolation structure 106 is formed as a fin sidewall spacer. Other isolation structure such as field oxide, LOCal Oxidation of Silicon (LOCOS), and/or other suitable structures are possible. The isolation structure 106 may include a multi-layer structure, for example, having one or more thermal oxide liner layers.

In the present embodiment, each MDL fin 114a is disposed between two semiconductor fins that are of different conductivity types (i.e., between a semiconductor fin 110 and a semiconductor fin 112), and each MDL fin 114b is disposed between two semiconductor fins that are of same conductivity type (i.e., between two semiconductor fins 110 or between a two semiconductor fins 112). The MDL fins 114a and 114b help improve the uniformity of the fin density, which benefits certain fabrication processes such as gate layer formation and metal layer formation. Each MDL fin 114a includes a dielectric layer 134a and a dielectric layer 136a. Each MDL fin 114b includes a dielectric layer 134b and a dielectric layer 136b. In this embodiment, the dielectric layers 134a and 134b are the outer dielectric layers for the MDL fins 114a and 114b, respectively; and the dielectric layers 136a and 136b are the inner dielectric layers for the MDL fins 114a and 114b, respectively, because they are disposed over the outer dielectric layers 134a and 134b, respectively.

The dielectric material(s) in the dielectric layers 134a and 134b is different from the dielectric material(s) in the dielectric layers 136a and 136b. In the present embodiment, the dielectric layers 134a and 134b include a dielectric material having a dielectric constant equal to or less than 5, and the dielectric layers 136a and 136b include a dielectric material having a dielectric constant equal to or greater than 7. For example, the dielectric layers 134a and 134b may include silicon oxide (e.g., $SiO_2$), silicon oxycarbide (e.g., SiOC), silicon oxycarbide nitride (SiOCN), silicon oxide with carbon contents, silicon oxide with nitrogen contents, or a combination thereof. For example, the dielectric layers 136a and 136b may include a nitride based dielectric, a metal oxide based dielectric, hafnium oxide ($HfO_2$), tantalum oxide ($Ta_2O_5$), titanium oxide ($TiO_2$), zirconium oxide ($ZrO_2$), aluminum oxide ($Al_2O_3$), yttrium oxide ($Y_2O_3$), or a combination thereof. The lower dielectric constant material(s) in the dielectric layers 134a and 134b helps reduce the coupling capacitance between adjacent gate structures 118. This helps improve the performance (e.g., switching speed) of the device 100. Meanwhile, the higher dielectric constant material(s) in the dielectric layers 136a and 136b helps maintain the height of the dielectric layers 136a and 136b during various etching processes, such as the etching processes to recess the isolation structure 106 and the etching processes to cut the gate structure 118. The height of the dielectric layers 136a and 136b helps isolate epitaxial features during S/D epitaxial growth process. For example, as shown in FIGS. 3 and 4, the dielectric layers 136a and 136b remain tall and stand between the S/D epitaxial features 122 and 124. The above benefits (e.g., reduced gate coupling capacitance and isolated S/D epitaxial features) cannot be achieved by a dielectric fin with only a single dielectric material.

In an embodiment, the isolation structure 106 is deposited as a spacer layer over the sidewalls of the semiconductor fins 110 and 112. Before the isolation structure 106 is recessed to be lower than the semiconductor fins 110 and 112, the dielectric layers 134a and 134b are deposited over the sidewalls of the isolation structure 106 as a conformal layer, for example, having a thickness ranging from 1 nm to 15 nm. Thereafter, the dielectric layers 136a and 136b are deposited to fill in the space between the dielectric layers 134a and 134b. The dielectric layers 134a, 134b, 136a, and 136b may be deposited using chemical vapor deposition (CVD), atomic layer deposition (ALD), or other suitable methods. Subsequently, the isolation structure 106 is recessed (e.g., by a chemical etching process) to be lower than the top surface of the semiconductor fins 110 and 112 and the top surface of the MDL fins 114a and 114b.

The gate structures 118 include a gate dielectric layer 130 and a gate electrode layer 132. The gate dielectric layer 130 may include silicon oxide ($SiO_2$), silicon oxynitride (SiON), aluminum silicon oxide (AlSiO), a high-k dielectric material such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. The gate dielectric layer 130 may be deposited by chemical oxidation, thermal oxidation, atomic layer deposition (ALD), or other suitable methods. The gate electrode layer 132 may include a work function metal layer, a metal fill layer, and other suitable layers such as barrier layer(s) and capping layer(s). The work function metal layer may be a p-type or an n-type work function layer for the p-type FinFETs and n-type FinFETs, respectively. The p-type work function layer comprises a metal such as titanium nitride (TiN), tantalum nitride (TaN), ruthenium (Ru), molybdenum (Mo), tungsten (W), platinum (Pt), or combinations thereof. The n-type work function layer comprises a metal such as titanium (Ti), aluminum (Al), tantalum carbide (TaC), tantalum carbide nitride (TaCN), tantalum silicon nitride (TaSiN), or combinations thereof. The work function metal layer may include a plurality of layers and may be deposited by CVD, physical vapor deposition (PVD), and/or other suitable process. The metal fill layer may include aluminum (Al), tungsten (W), cobalt (Co), copper (Cu), and/or other suitable materials. The metal fill layer may be formed by CVD, PVD, plating, and/or other suitable processes.

The gate spacer 120 may include one or more dielectric layers having silicon nitride ($Si_3N_4$), silicon oxide ($SiO_2$), silicon carbide (SiC), silicon carbide nitride (SiCN), silicon oxynitride (SiON), silicon oxycarbide (SiOC), silicon oxycarbide nitride (SiOCN), a low-k dielectric material, other materials, or a combination thereof. The gate spacer 120 may be formed by one or more methods including chemical oxidation, thermal oxidation, ALD, CVD, and/or other suitable methods.

The S/D epitaxial features 122 may include epitaxially grown semiconductor material(s) such as epitaxially grown silicon for n-type FinFETs, and may additionally include one or more n-type dopants, such as phosphorus or arsenic. The S/D epitaxial features 124 may include epitaxially grown semiconductor material(s) such as epitaxially grown silicon germanium for p-type FinFETs, and may additionally include one or more p-type dopants, such as boron or indium. The S/D epitaxial features 122 and 124 may be formed by a low-pressure CVD (LPCVD) process with a silicon-based precursor, a selective epitaxial growth (SEG) process, a cyclic deposition and etching (CDE) process, or other epitaxial growth processes. In the present embodiment, the dielectric layer 136a and 136b are tall enough to prevent nearby S/D epitaxial features 122 and 124 from accidentally shorting to each other.

Figure 5:
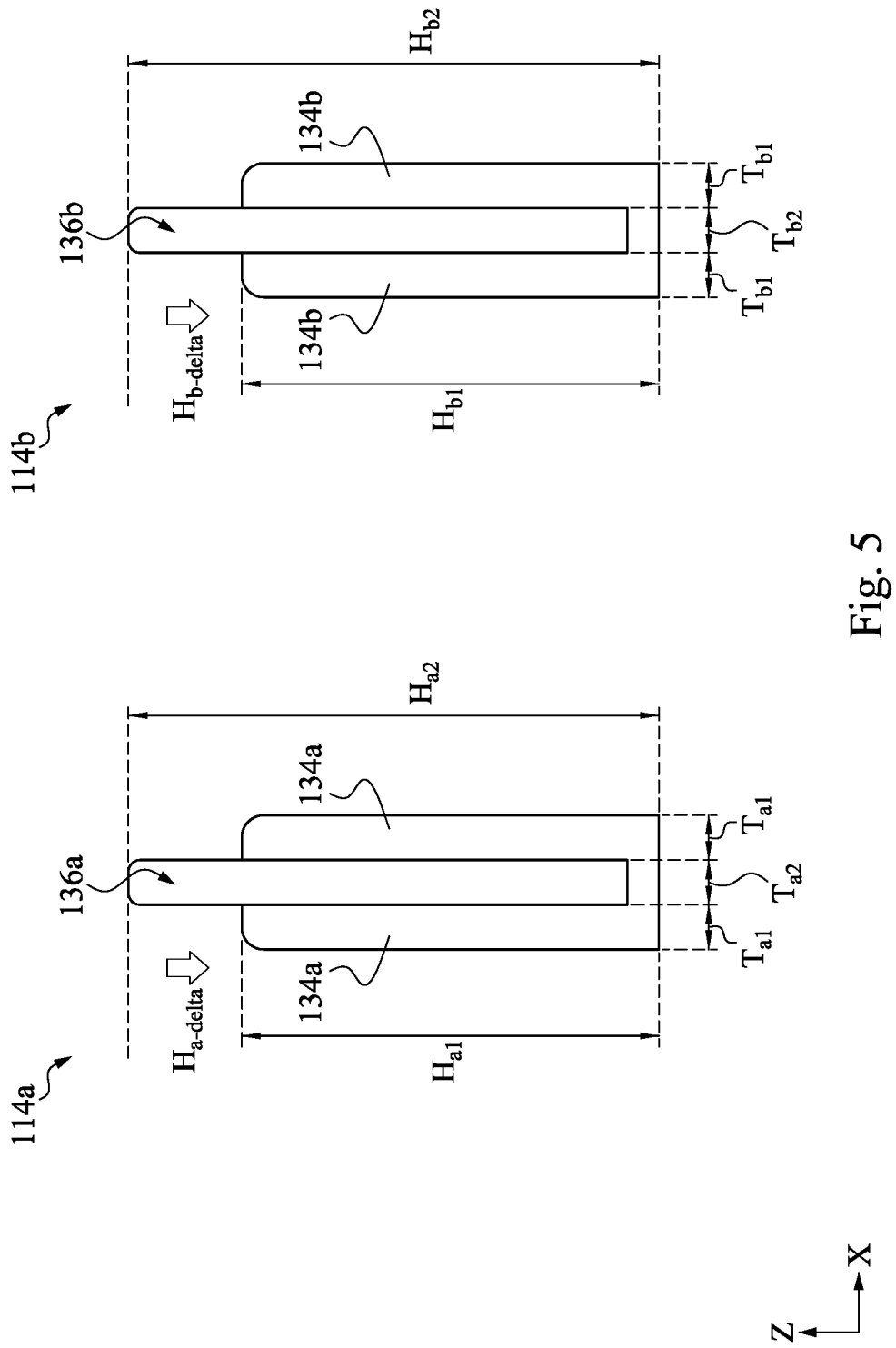
FIG. 5 illustrates cross-sectional views of two multi-dielectric-layer (MDL) fins according to some embodiments of the present disclosure.

FIG. 5 illustrates various dimensions of the MDL fins 114a and 114b. Referring to FIG. 5, the dielectric layer 134a has a height $H_{a1}$ (along the Z direction), the dielectric layer 136a has a height $H_{a2}$ as measured from the bottom of the dielectric layer 134a. The height $H_{a2}$ is greater than the height $H_{a1}$ by about 3 nm or more in the present embodiment (i.e., $H_{a\text{-}delta} \geq 3$ nm). The dielectric layer 134a has a thickness $T_{a1}$ (along the X direction), and the dielectric layer 136a has a thickness $T_{a2}$. In an embodiment, the thickness $T_{a1}$ is in a range from about 1 nm to about 15 nm, and the thickness $T_{a2}$ is in a range from about 2 nm to about 30 nm.

Figure 10:
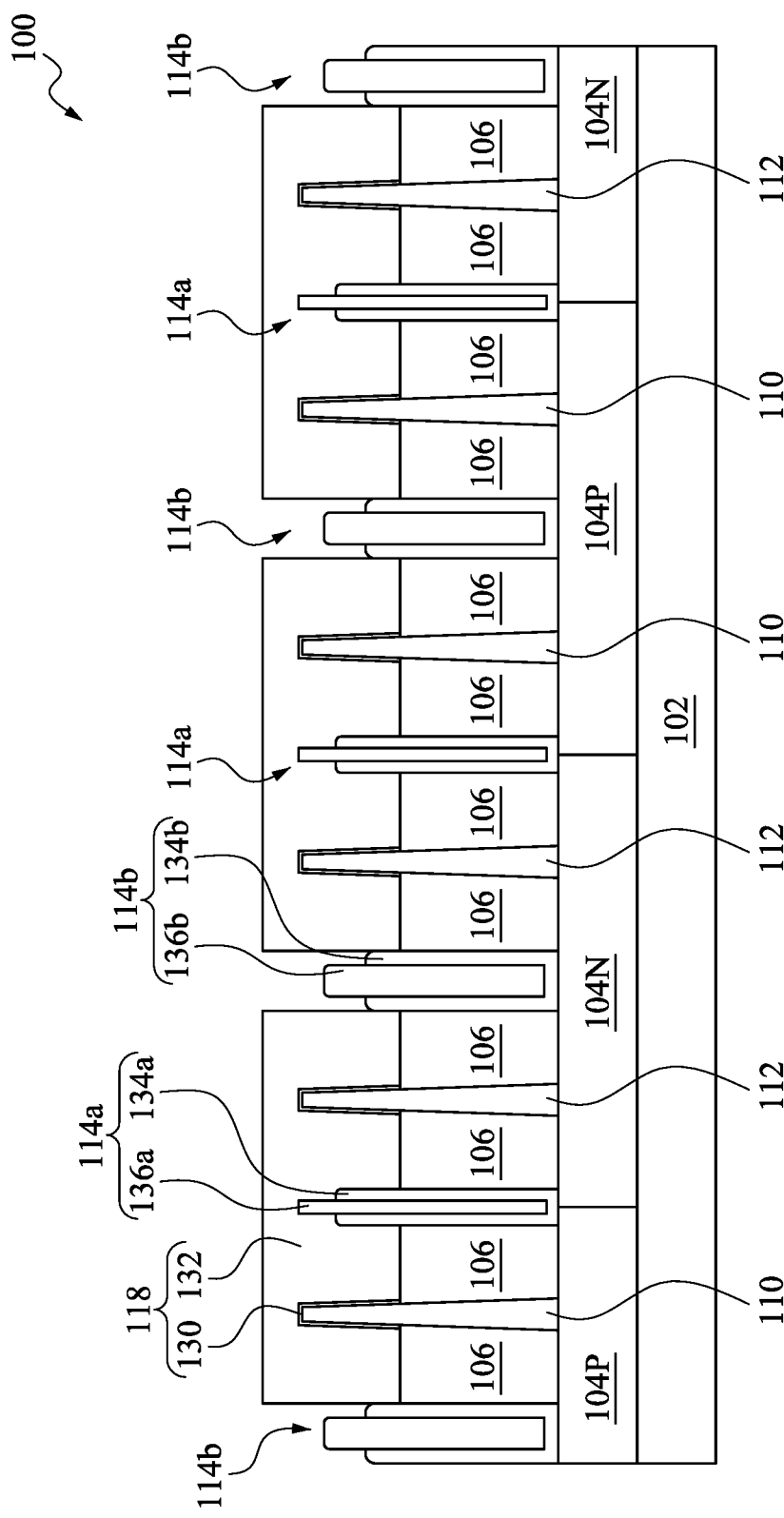
FIGS. 10 and 11 are cross-sectional views of the portion of the semiconductor device in FIG. 1 along the A-A line of FIG. 1, according to some embodiments of the present disclosure.
Figure 11:
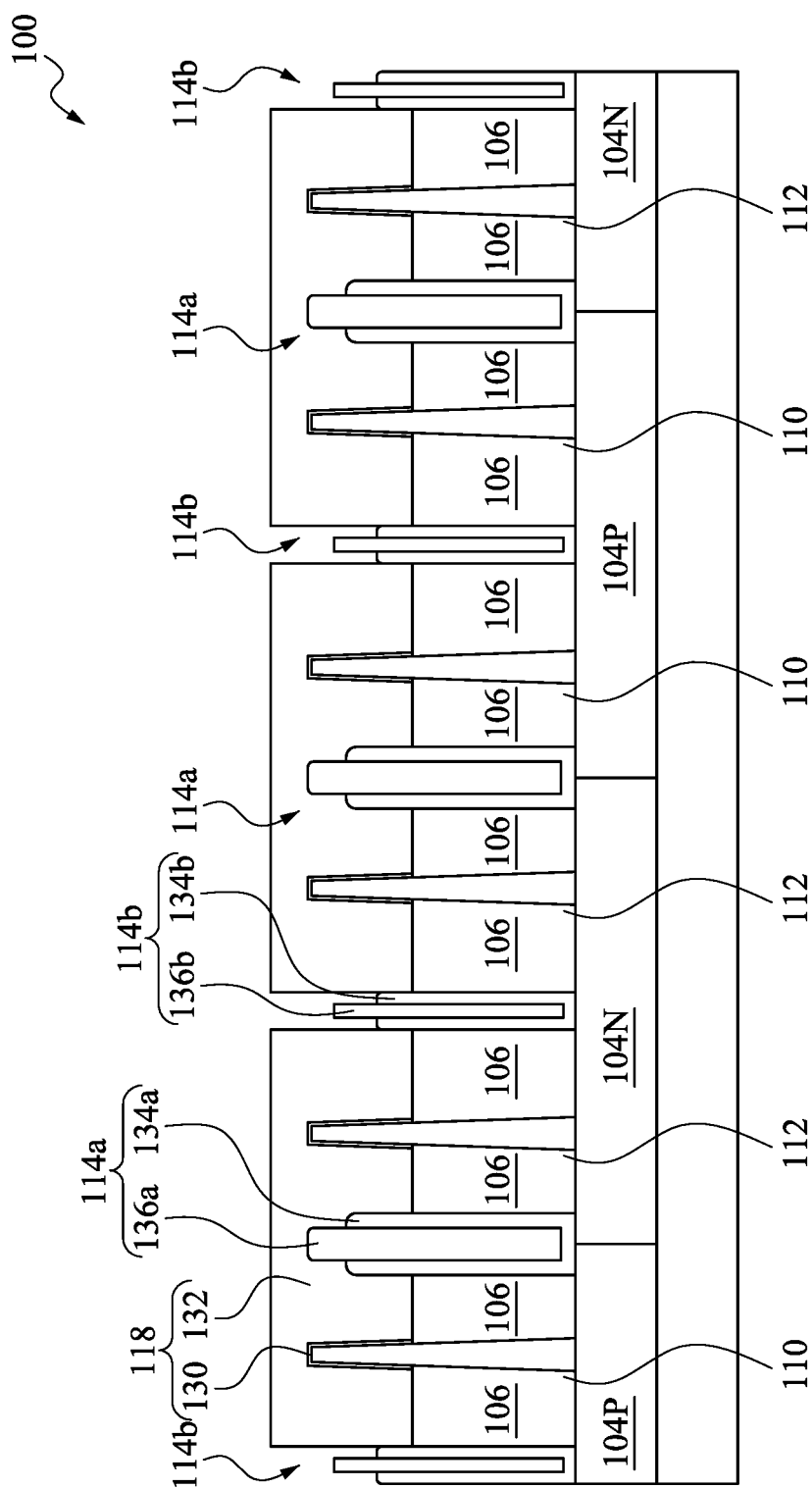

Still referring to FIG. 5, the dielectric layer 134b has a height $H_{b1}$ (along the Z direction), the dielectric layer 136b has a height $H_{b2}$ as measured from the bottom of the dielectric layer 134b. The height $H_{b2}$ is greater than the height $H_{b1}$ by about 3 nm or more in the present embodiment (i.e., $H_{b\text{-}delta} \geq 3$ nm). The dielectric layer 134b has a thickness $T_{b1}$ (along the X direction), and the dielectric layer 136b has a thickness $T_{b2}$. In an embodiment, the thickness $T_{b1}$ is in a range from about 1 nm to about 15 nm, and the thickness $T_{b2}$ is in a range from about 2 nm to about 30 nm. The thickness $T_{a2}$ and $T_{b2}$ may be substantially the same in some embodiments as shown in FIGS. 3 and 4. In some embodiments as shown in FIG. 10, the thickness $T_{a2}$ may be smaller than the thickness $T_{b2}$. In some embodiments as shown in FIG. 11, the thickness $T_{a2}$ may be greater than the thickness $T_{b2}$.

In the cross-sectional view as illustrated in FIG. 3, the dielectric layer 136a is taller than the dielectric layer 136b (i.e., a top surface of the dielectric layer 136a is higher than a top surface of the dielectric layer 136b). Further, the dielectric layer 134a is taller than the dielectric layer 134b (i.e., a top surface of the dielectric layer 134a is higher than a top surface of the dielectric layer 134b). This is due to some etching processes applied to the MDL fins 114b while the MDL fins 114a is covered under the gate structure 118. In the cross-sectional view as illustrated in FIG. 4, the dielectric layers 134a and 134b have about the same height, and the dielectric layers 136a and 136b have about the same height. This is because the dielectric layers 134a, 134b, 136a, and 136b undergo substantially the same etching processes in these areas.

Figure 6:
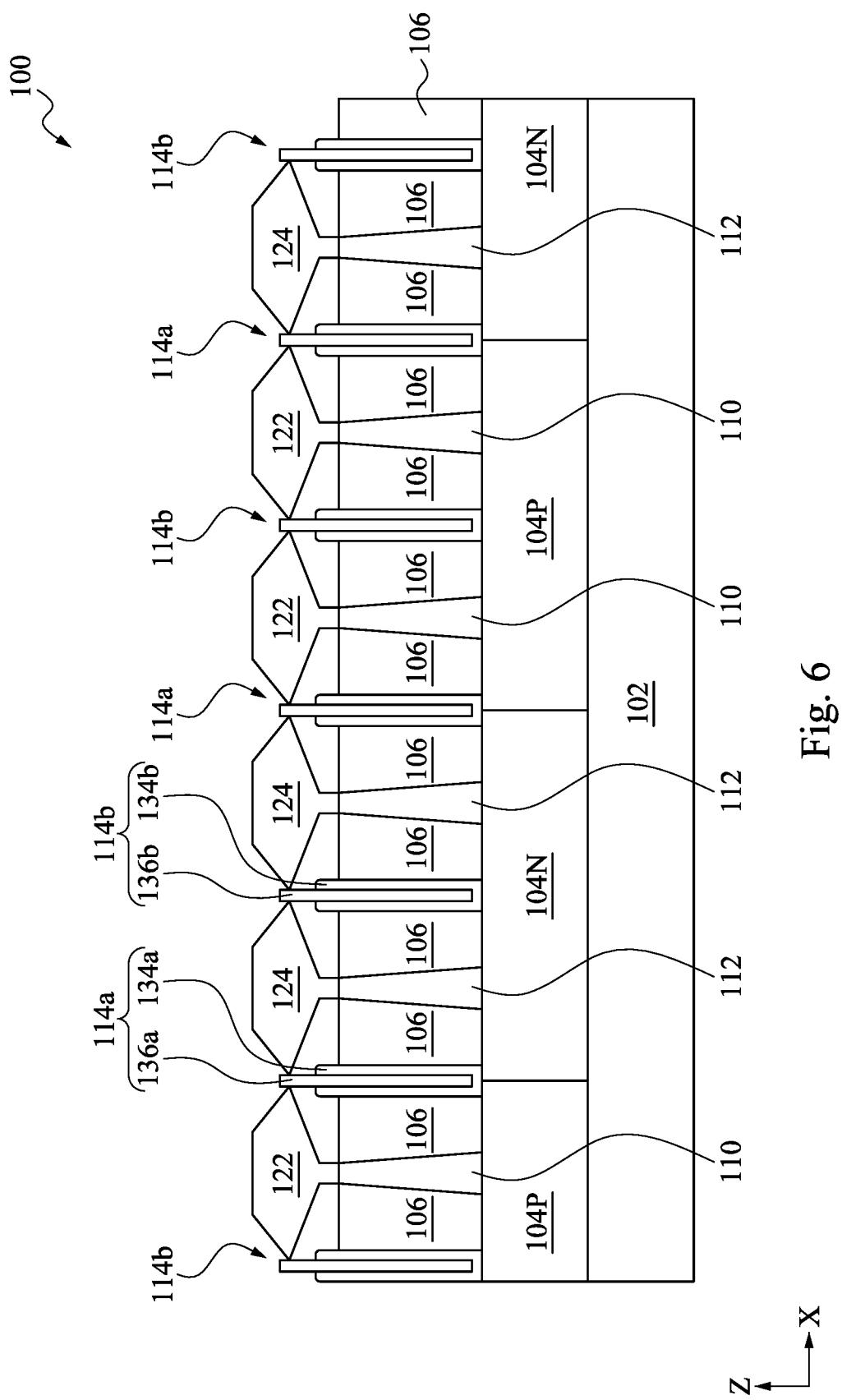
FIG. 6 is a cross-sectional view of the portion of the semiconductor device in FIG. 1 along the B-B line of FIG. 1, according to some embodiments of the present disclosure.

FIG. 6 illustrates a cross-sectional view of the device 100 along the B-B line of FIG. 1 (or FIG. 2) according to some embodiment. Referring to FIG. 6, the S/D epitaxial features 122 and 124 are grown to maximum or near-maximum volume. In some instances, the S/D epitaxial features 122 or 124 come into direct contact with adjacent dielectric layers 136a and 136b. Without the dielectric layers 136a and 136b, some of the S/D epitaxial features 122 and 124 might accidentally merge, causing manufacturing defects. In devices without the MDL fins 114a and 114b, in order to avoid such accidental merging, the volume of the S/D epitaxial features would need to be made small. Compared to those devices, the device 100 according to the present disclosure can provide large S/D epitaxial features 122 and 124, which not only increase the strain in the respective FinFETs (thus improving transistor performance), but also increase S/D contact landing area for reduced S/D contact resistance. Having the MDL fins 114a and 114b in this configuration allows each FinFET to have a single semiconductor fin (110 or 112), which increases the density of standard cell circuit design and reduces cell active power and standby leakage due to narrow channel width.

Figure 7:
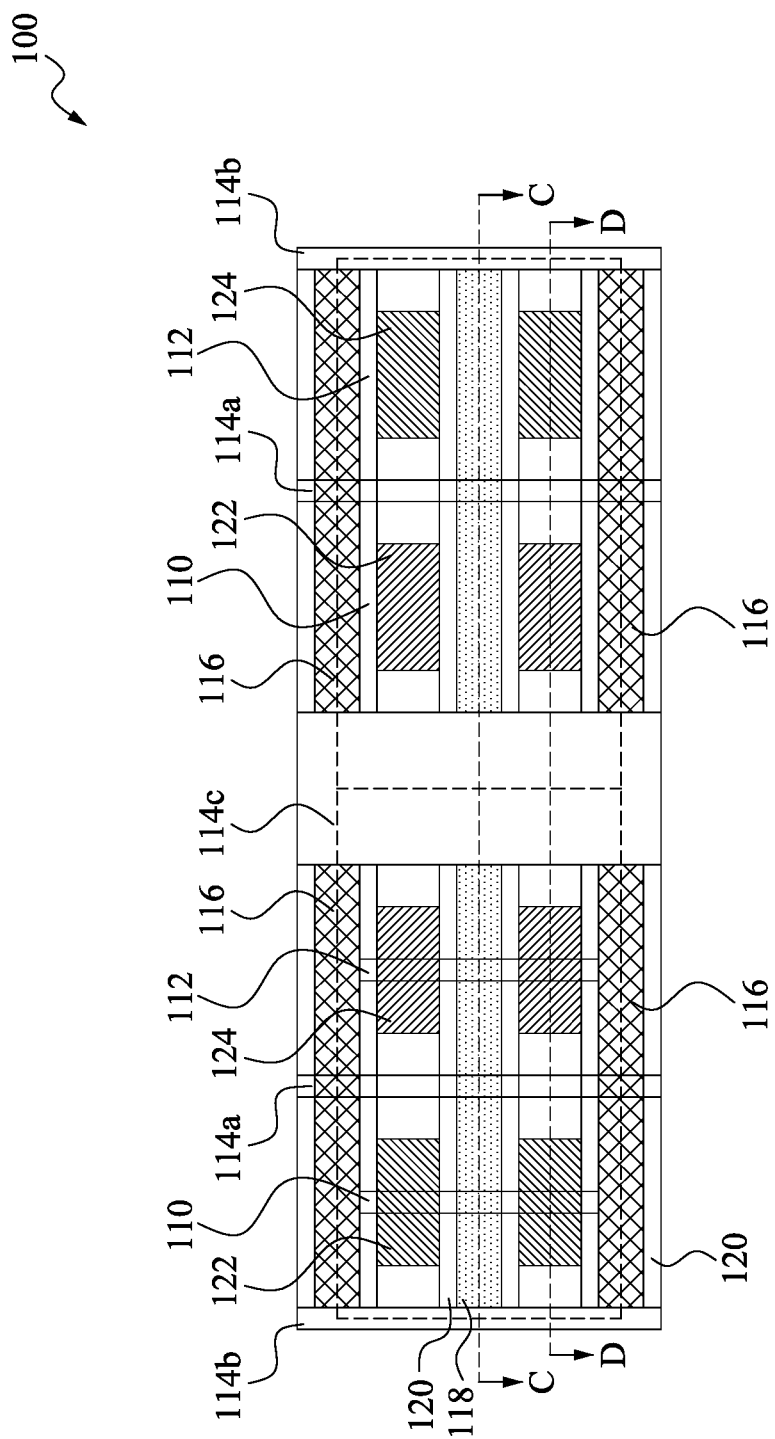
FIG. 7 is a top view of a portion of a semiconductor device, according to some embodiments of the present disclosure.
Figure 8:
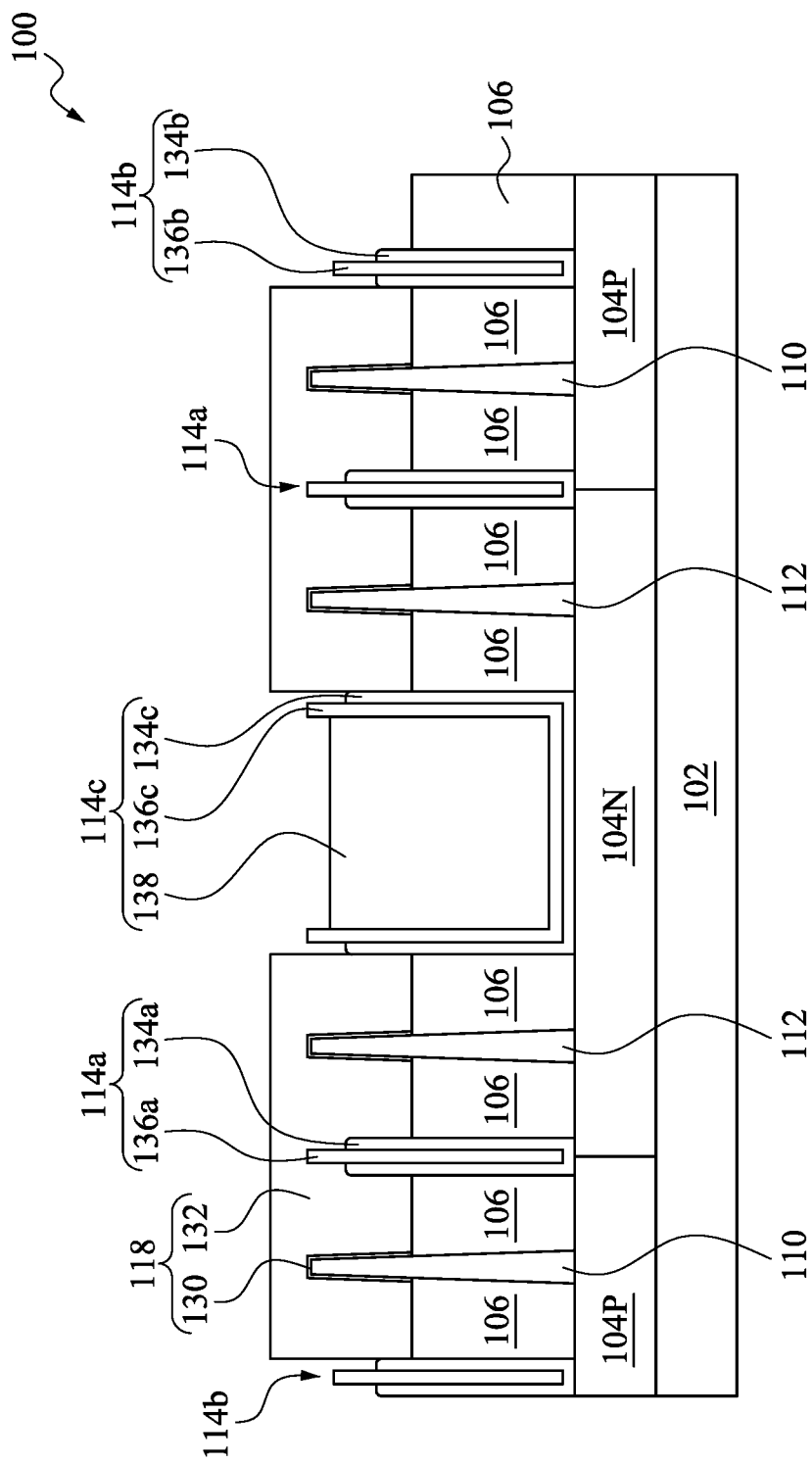
FIGS. 8 and 9 are cross-sectional views of the portion of the semiconductor device in FIG. 7 along the C-C and D-D lines of FIG. 7, respectively, according to some embodiments of the present disclosure.
Figure 9:
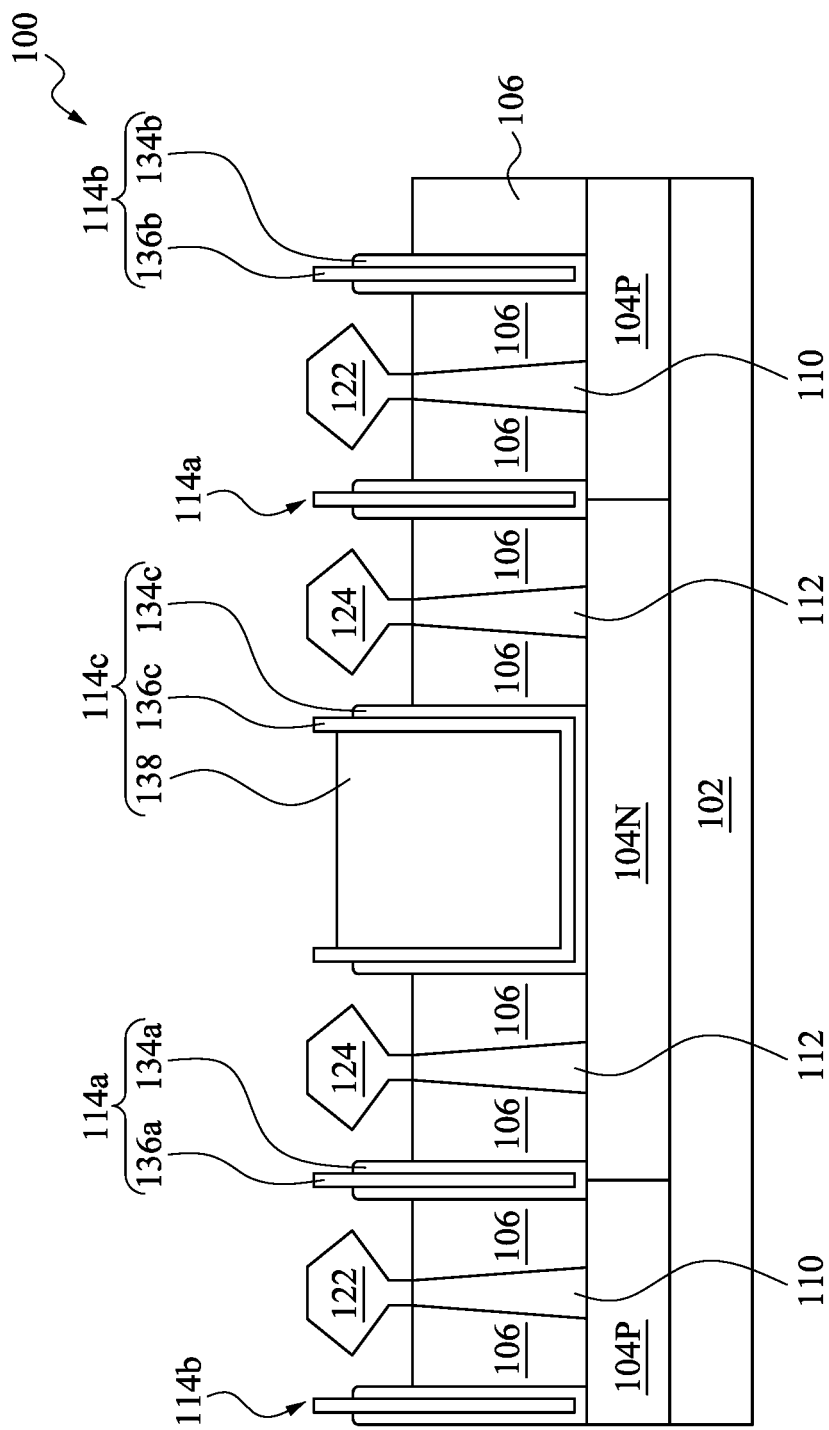

FIG. 7 illustrates a top view of the device 100 according to another embodiment. FIGS. 8 and 9 illustrate cross-sectional views of the device 100 along the C-C line and the D-D line of FIG. 7, respectively. Referring to FIGS. 7-9, the device 100 in this embodiment is substantially the same as the device 100 in FIGS. 1-6. However, the device 100 in this embodiment further includes another MDL fin 114c disposed at a cell boundary (i.e., the MDL fin 114c is located between two p-type FinFETs or between two n-type FinFETs). The MDL fin 114c includes one more dielectric layer than the MDL fins 114a and 114b. The MDL fin 114c includes three dielectric layers: 134c, 136c, and 138. The dielectric layer 134c includes the same material(s) as the dielectric layers 134a and 134b. The dielectric layer 136c includes the same material(s) as the dielectric layers 136a and 136b. The dielectric layer 134c is the outer layer of the MDL fin 114c. The dielectric layer 136c is disposed over the dielectric layer 134c. The dielectric layer 138 is disposed over the dielectric layer 136c. In the present embodiment, the dielectric material(s) in the dielectric layer 138 has a lower dielectric constant than the dielectric material(s) in the dielectric layer 136c. For example, the dielectric material(s) in the dielectric layer 138 may have a dielectric constant equal to or less than 5. For example, the dielectric layer 138 may include silicon oxide (e.g., $SiO_2$), silicon oxycarbide (e.g., SiOC), silicon oxycarbide nitride (SiOCN), silicon oxide with carbon content, silicon oxide with nitrogen content, or a combination thereof. The materials in the dielectric layers 134c and 138 may be the same or different in various embodiments. The top surface of the dielectric layer 138 may be lower than the top surface of the dielectric layer 136c, but higher than the top surface of the dielectric layer 134c in the present embodiment. Further, the MDL fin 114c is wider than the MDL fins 114a and 114b along the X direction. In some embodiments, the MDL fin 114c is wider than the MDL fins 114a and 114b by more than 50% to provide better cell-to-cell isolation. Other aspects of the device 100 in this embodiment are the same as those in FIGS. 1 and 3-6, and are omitted for the purpose of brevity.

FIG. 10 illustrates a cross-sectional view of the device 100 cut along the A-A line of FIG. 1 (or FIG. 2), according to another embodiment. In this embodiment, the MDL fin 114b is wider than the MDL fin 114a along the X direction. For example, the dielectric layer 136b may be wider than the dielectric layer 136a along the X direction, for example, by about 20%, while the dielectric layers 134a and 134b may have substantially the same width. The MDL fins 114b are disposed between two adjacent cells. The wider dielectric layer 136b provides better etch resistivity during various etching processes. Other aspects of the device 100 in this embodiment are the same as those in FIGS. 1-6, and are omitted for the purpose of brevity.

FIG. 11 illustrates a cross-sectional view of the device 100 cut along the A-A line of FIG. 1 (or FIG. 2), according to another embodiment. In this embodiment, the MDL fin 114b is narrower than the MDL fin 114a along the X direction. For example, the dielectric layer 136b may be narrower than the dielectric layer 136a along the X direction, for example, by about 20%, while the dielectric layers 134a and 134b may have substantially the same width. Other aspects of the device 100 in this embodiment are the same as those in FIGS. 1-6, and are omitted for the purpose of brevity.

Figure 12:
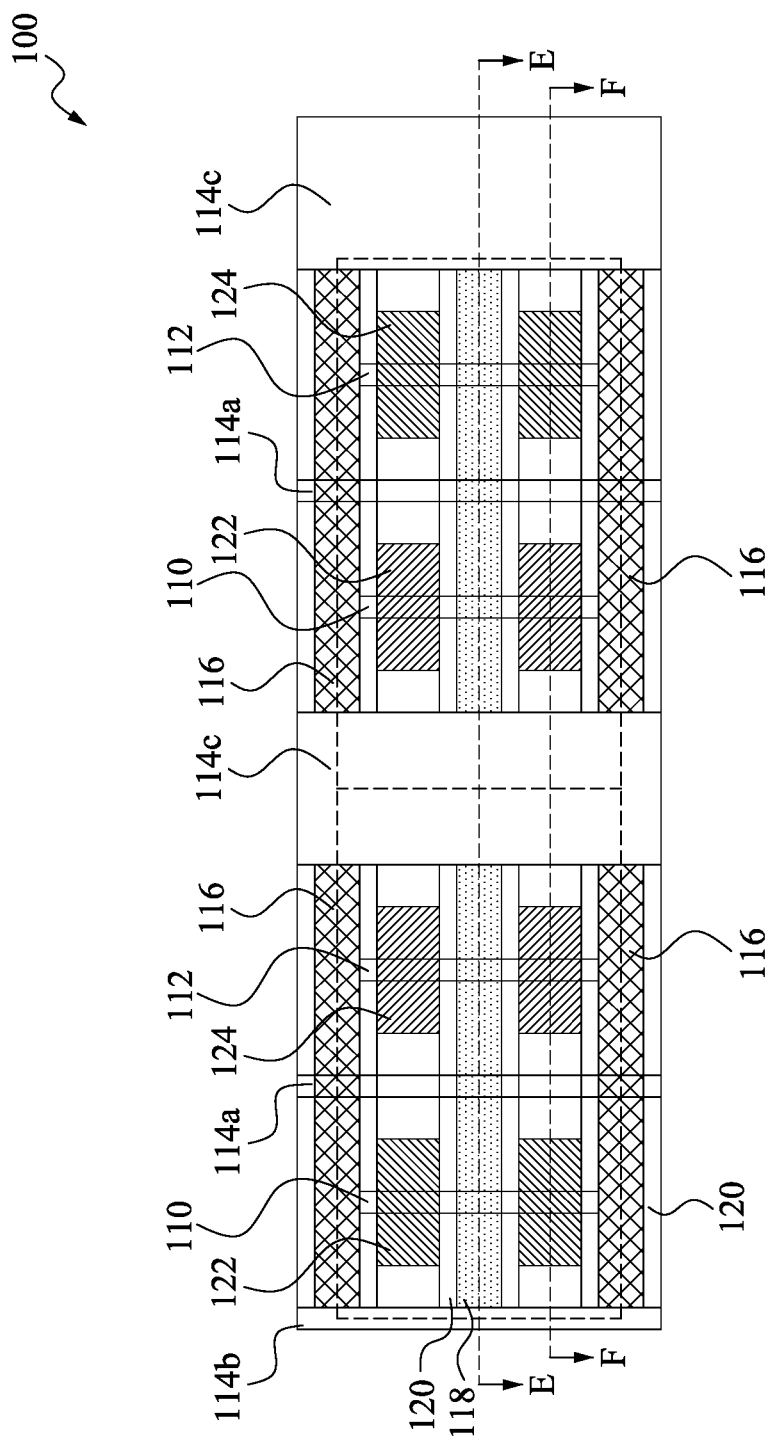
FIG. 12 is a top view of a portion of a semiconductor device, according to some embodiments of the present disclosure.
Figure 13:
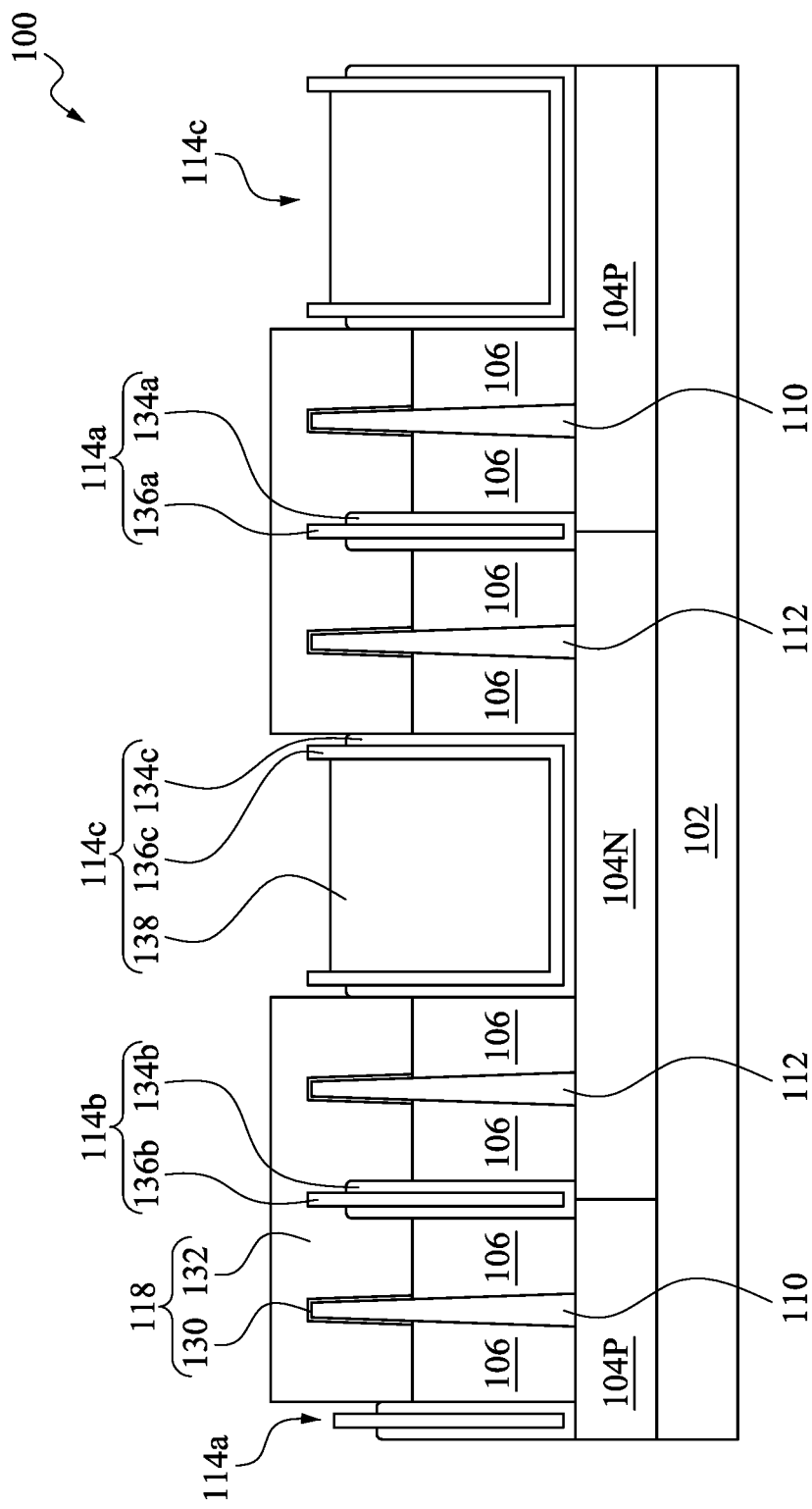
FIGS. 13 and 14 are cross-sectional views of the portion of the semiconductor device in FIG. 12 along the E-E and F-F lines of FIG. 12, respectively, according to some embodiments of the present disclosure.
Figure 14:
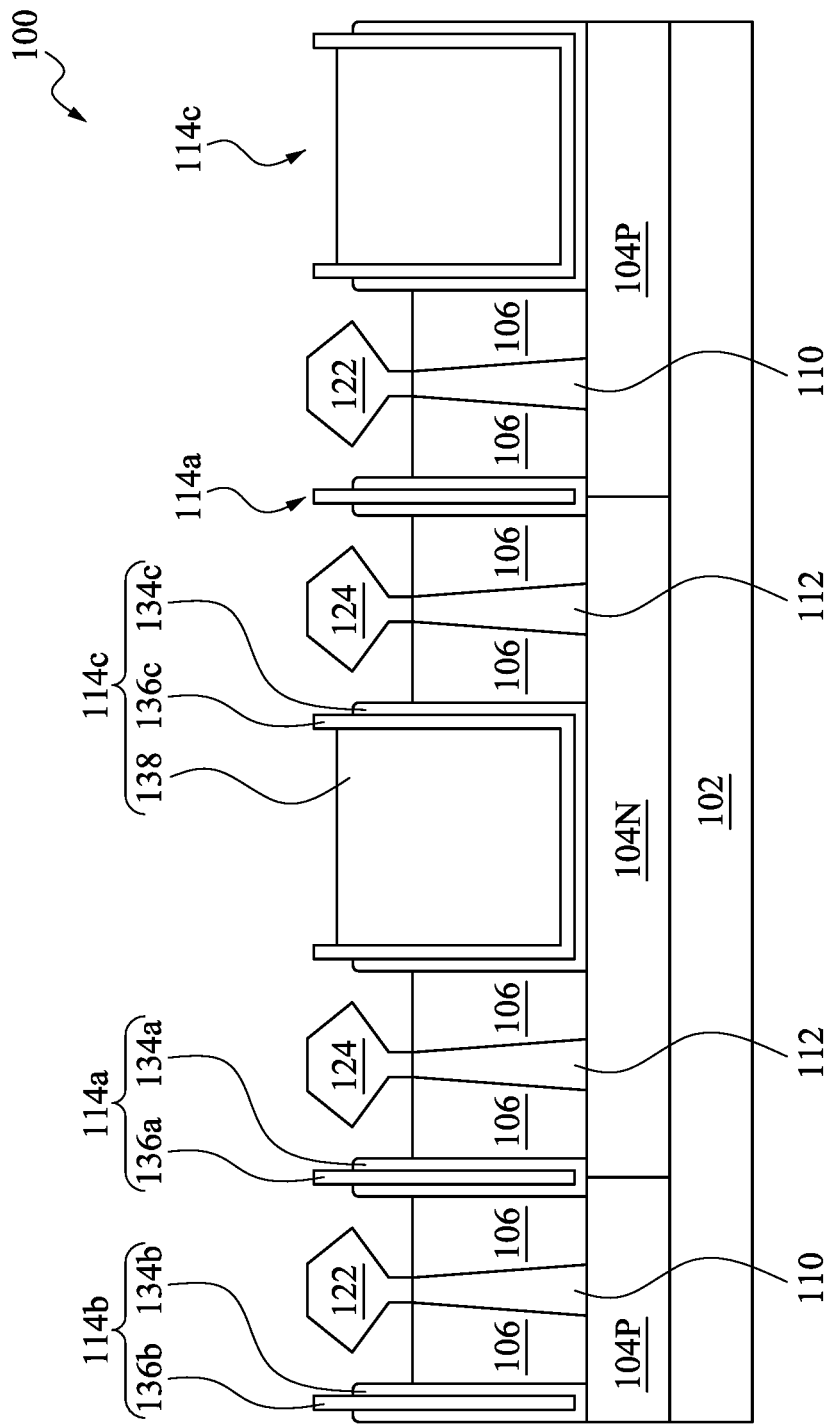

FIG. 12 illustrates a top view of the device 100 according to another embodiment. FIGS. 13 and 14 illustrate cross-sectional views of the device 100 along the E-E line and the F-F line of FIG. 12, respectively. The device 100 in this embodiment is substantially the same as the device 100 in FIGS. 7-9 except that the MDL fins 114c are disposed between two n-type FinFETs and between two p-type FinFETs.

Figure 15:
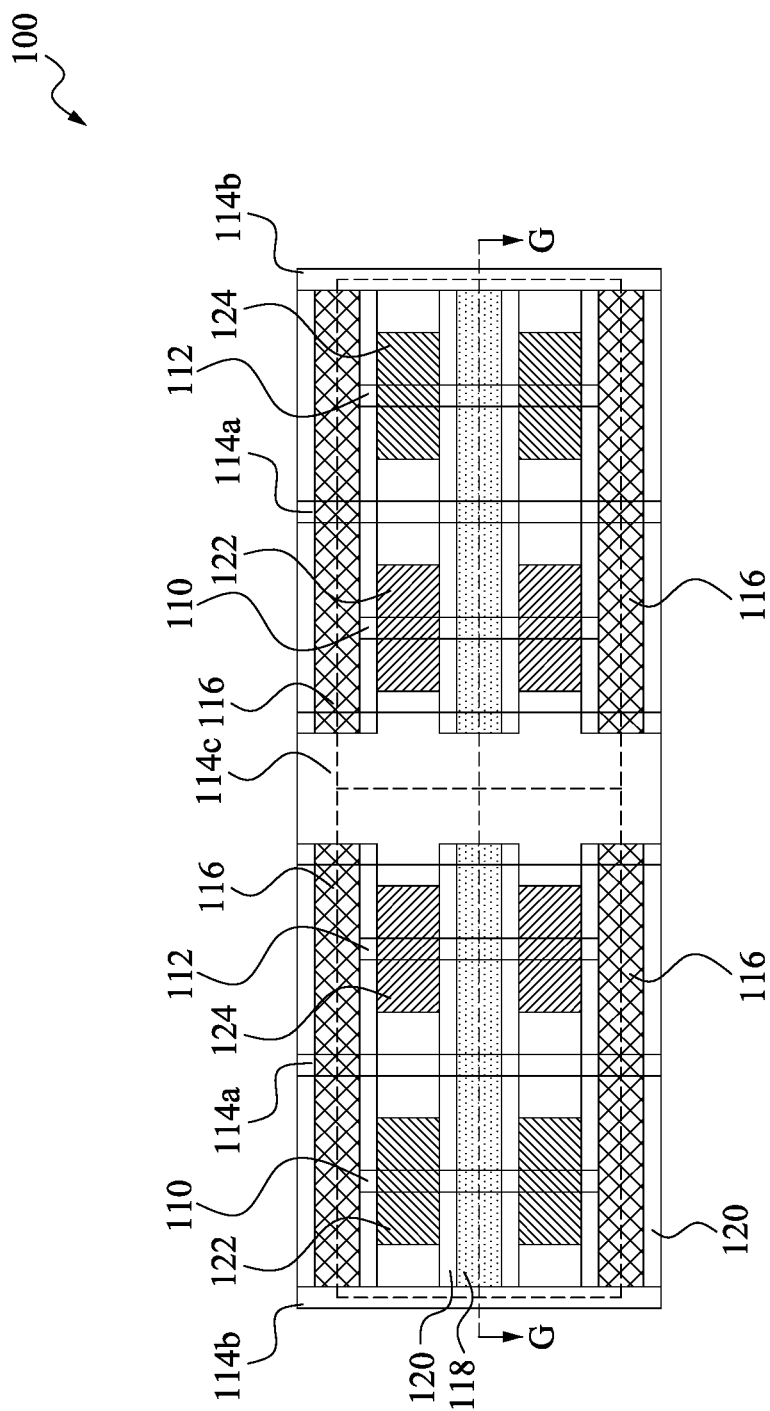
FIG. 15 is a top view of a portion of a semiconductor device, according to some embodiments of the present disclosure.
Figure 16:
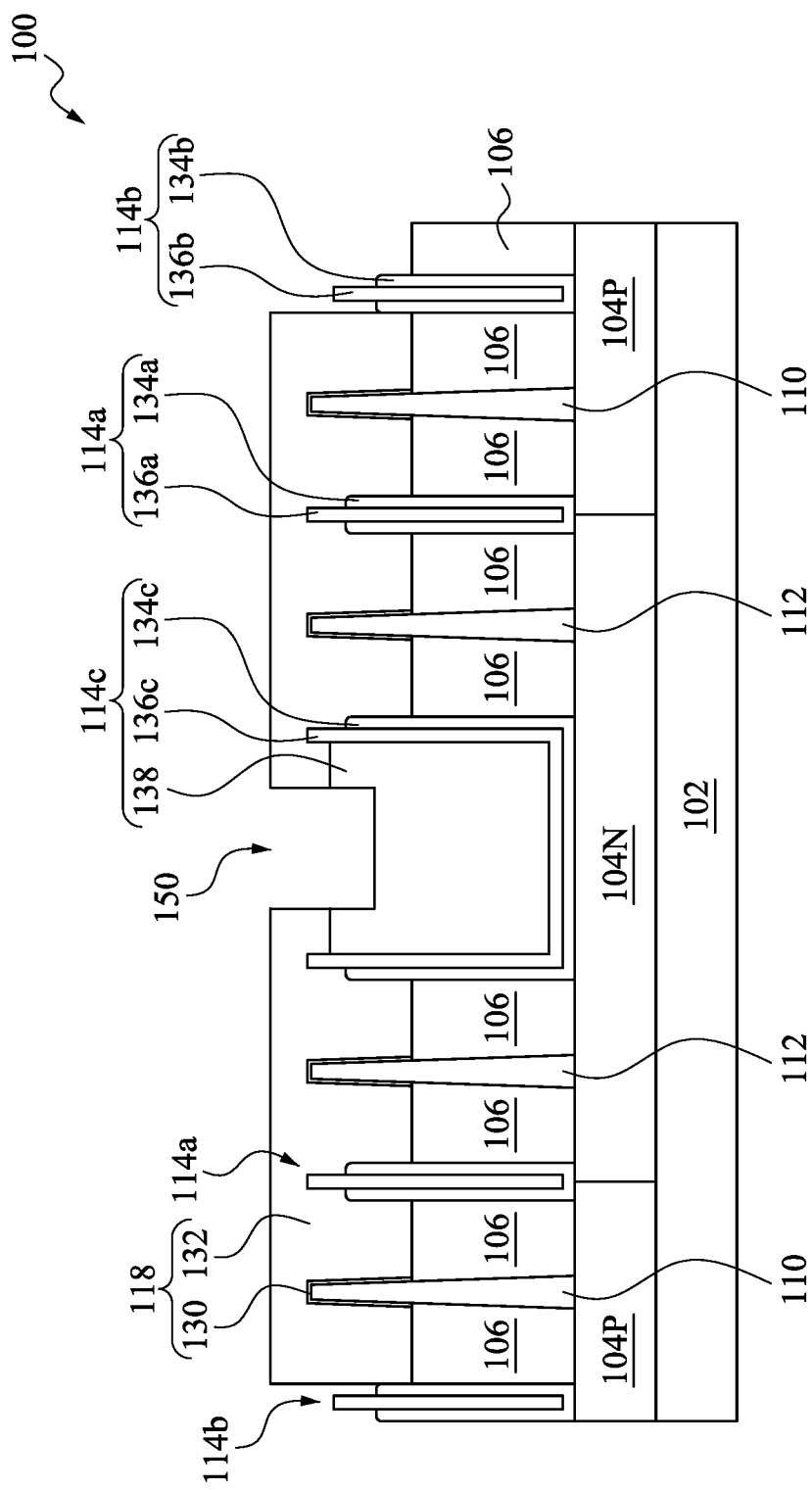
FIG. 16 is a cross-sectional view of the portion of the semiconductor device in FIG. 15 along the G-G line of FIG. 15, according to some embodiments of the present disclosure.

FIG. 15 illustrates a top view of the device 100 according to another embodiment. FIG. 16 illustrates a cross-sectional view of the device 100 along the G-G line of FIG. 15. The device 100 in this embodiment is substantially the same as the device 100 in FIGS. 7-9 except that the gate structures 118, the isolation structure 116, and the spacers 120 extend into the MDL fin 114c. Referring to FIG. 16, in this embodiment, the gate structures 118 partially overlap with the MDL fin 114c. The space 150 between the adjacent structures 118 and above the dielectric layer 138 corresponds to an unmasked area during a photolithography process that etches the gate structures 118. Having the wide dielectric layer 138 provides large design margin for the photolithography process.

Figure 17:
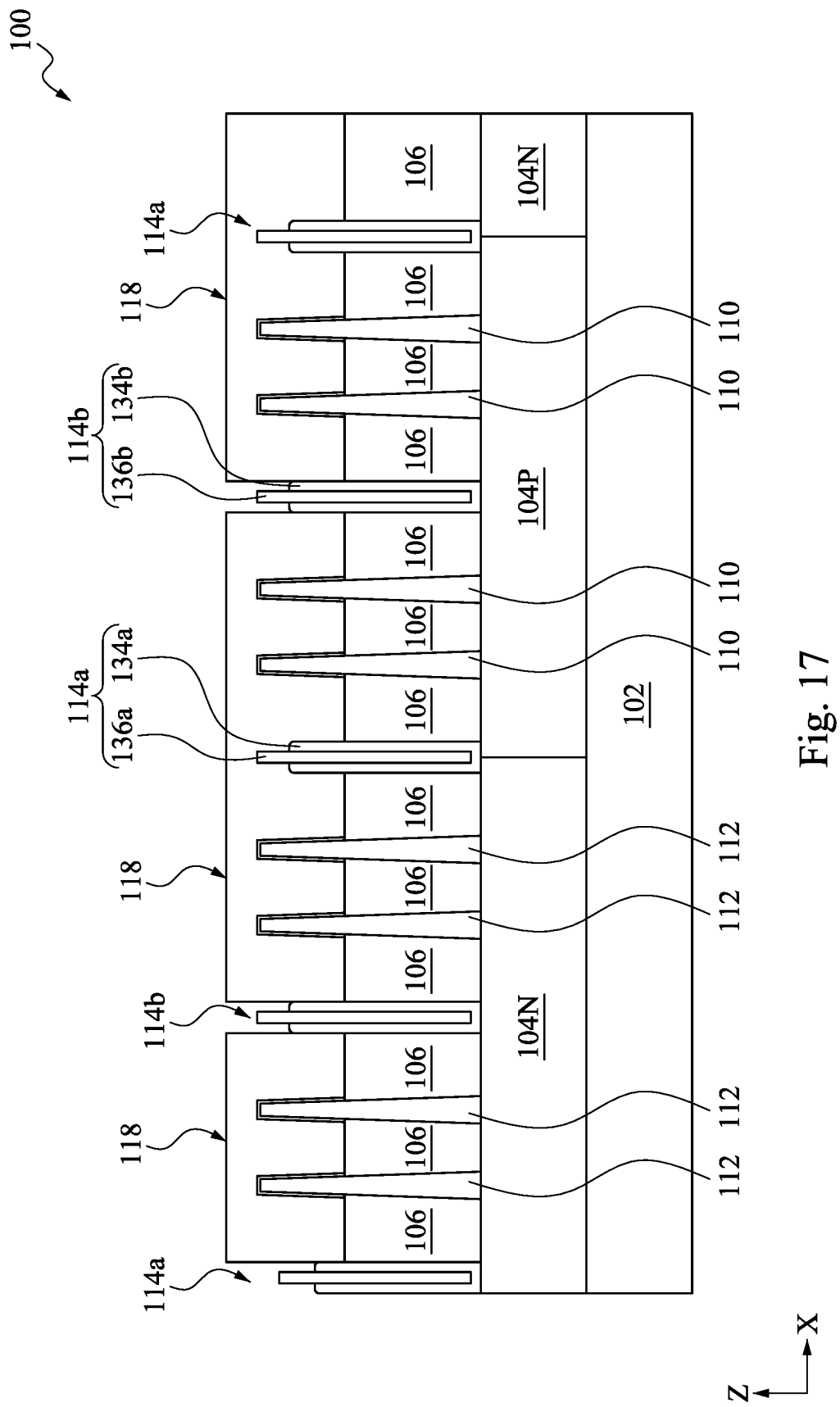
FIGS. 17 and 18 are cross-sectional views of a portion of a semiconductor device, according to some embodiments of the present disclosure.
Figure 18:
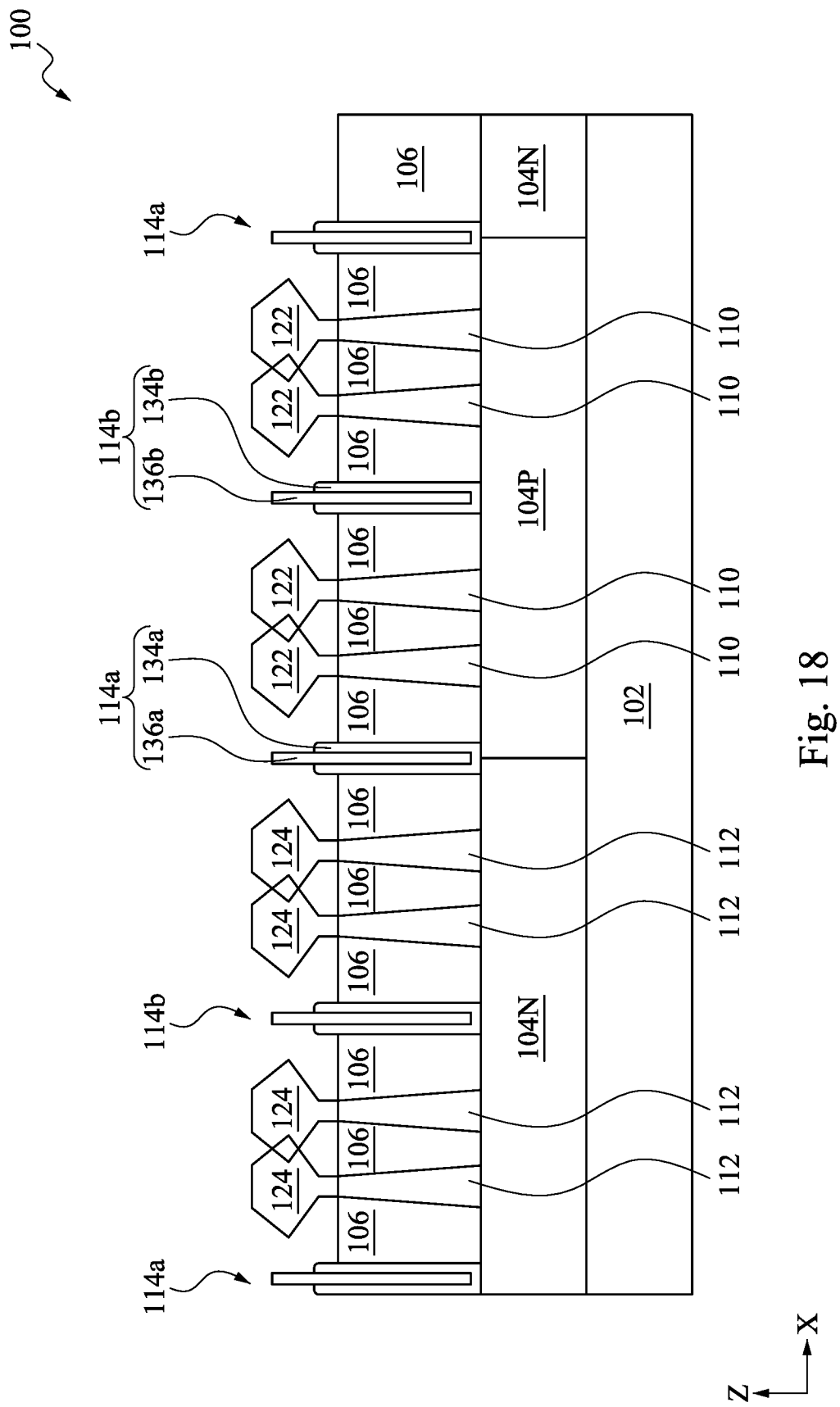

FIG. 17 illustrates a cross-sectional view of the device 100 according to another embodiment, cut along the length of the gate structures 118. FIG. 18 illustrates a cross-sectional view of the device 100 of this embodiment, cut into the S/D area. Referring to FIGS. 17 and 18, the device 100 in this embodiment is substantially the same as the device 100 in FIGS. 1-6 except that some or all of the cells include multi-fin FinFETs. For example, in this embodiment, an n-type FinFET may include two semiconductor fins 110, and a p-type FinFET may include two semiconductor fins 112. The MDL fins 114a are disposed between a semiconductor fin 110 and a semiconductor fin 112 within a cell. The MDL fins 114b are disposed between two cells. The S/D epitaxial features 122 within the same cell merge into a large epitaxial feature. The S/D epitaxial features 124 within the same cell merge into a large epitaxial feature. The S/D epitaxial features 122 and 124 from different cells are separated by the MDL fins 114a and 114b.

Figure 19:
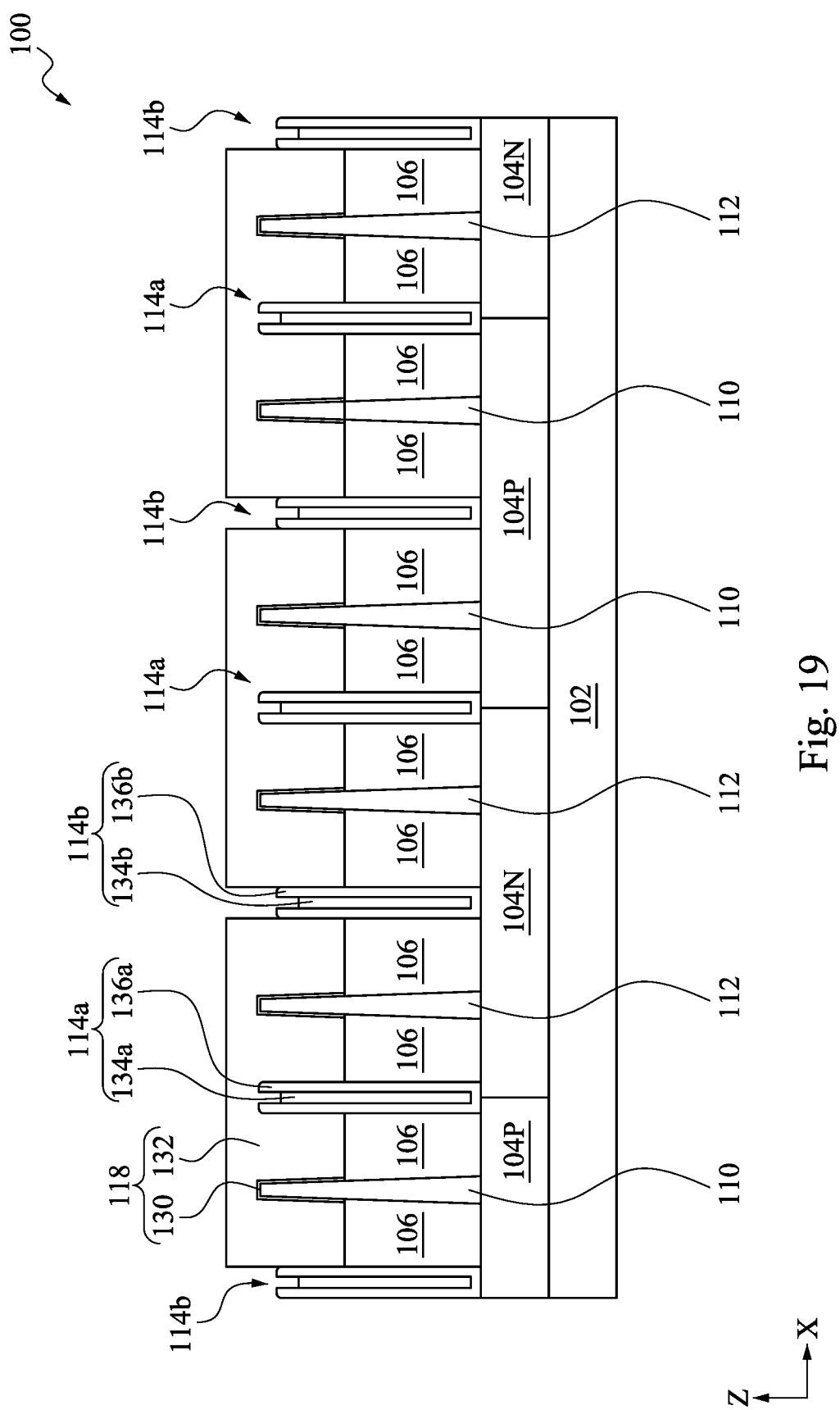
FIGS. 19 and 20 are cross-sectional views of the portion of the semiconductor device in FIG. 1 along the A-A and B-B lines of FIG. 1, respectively, according to some embodiments of the present disclosure.
Figure 20:
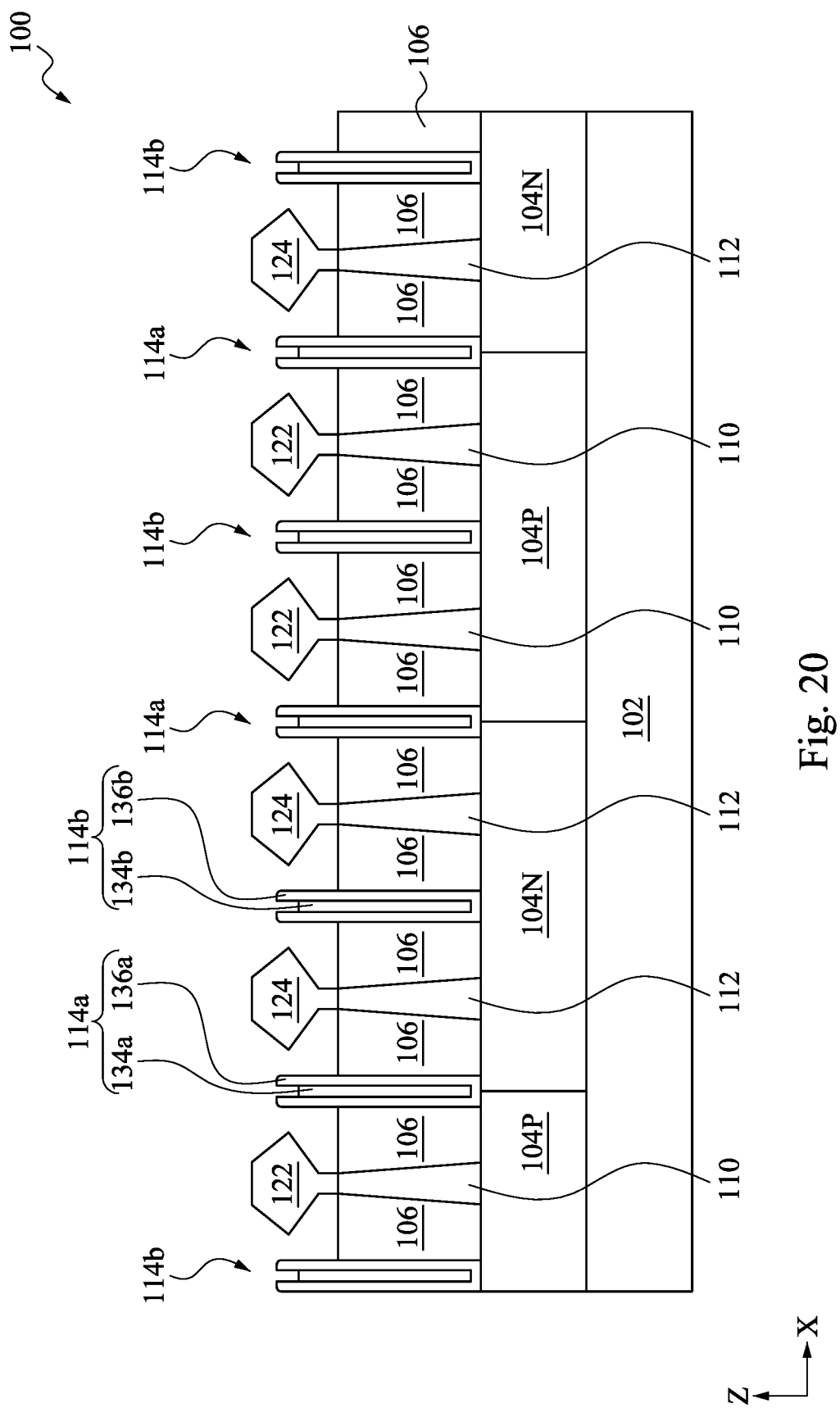
Figure 21:
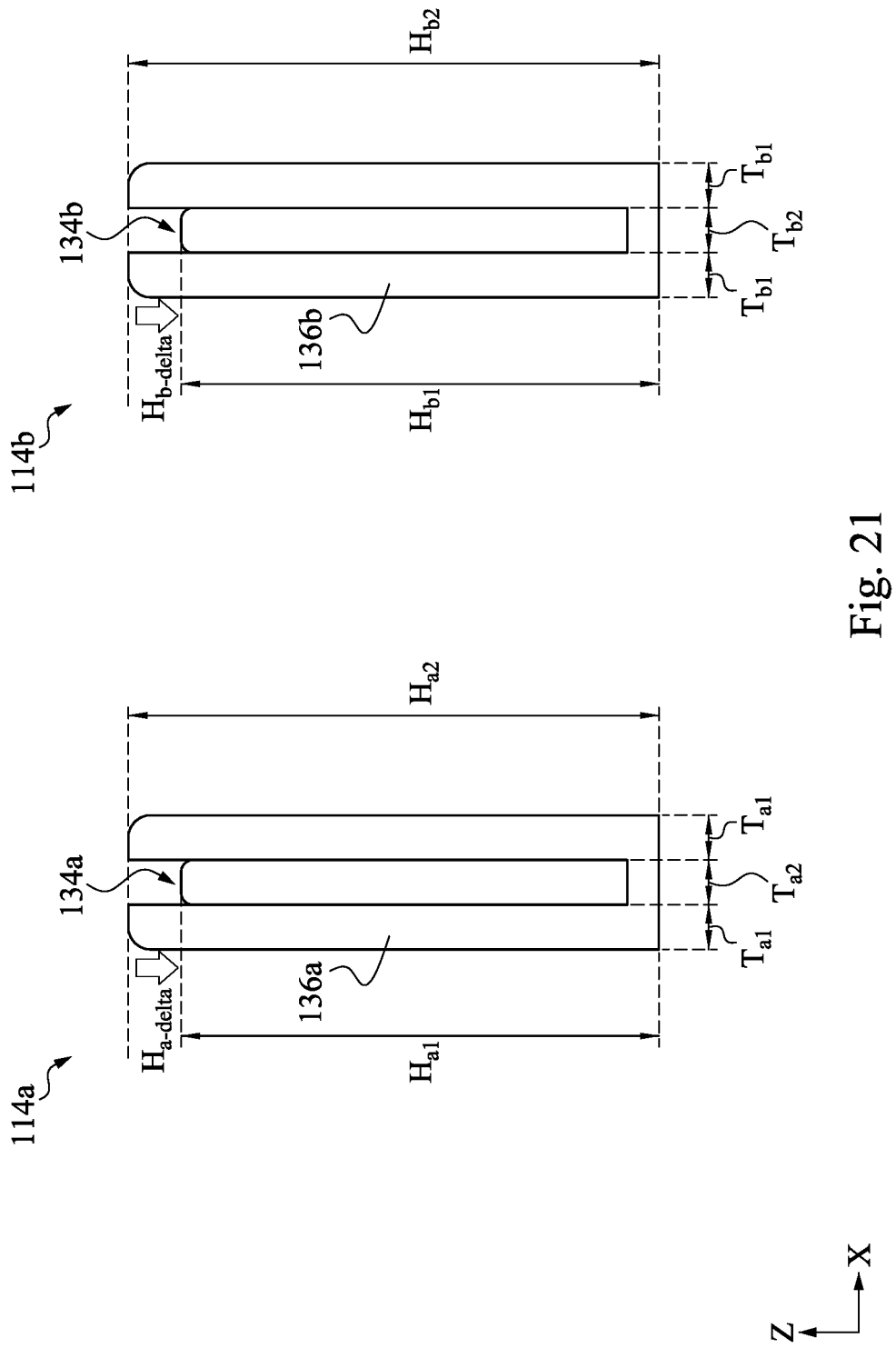
FIG. 21 illustrates cross-sectional views of two multi-dielectric-layer (MDL) fins according to some embodiments of the present disclosure.

FIGS. 19 and 20 illustrate cross-sectional views of the device 100 in another embodiment, along the A-A and B-B lines of FIG. 1 (or FIG. 2), respectively. The device 100 in this embodiment is substantially the same as the device 100 in FIGS. 1-6 except that the dielectric layers 136a and 136b are the outer layers of the MDL fins 114a and 114b respectively and the dielectric layers 134a and 134b are the inner layers of the MDL fins 114a and 114b respectively. As such, the inner layer is lower than the outer layer in each of the MDL fins 114a and 114b. FIG. 21 illustrates various dimensions of the MDL fins 114a and 114b in this embodiment. The various dimensions $H_{a\text{-}delta}$, $H_{b\text{-}delta}$, $H_{a1}$, $H_{a2}$, $H_{b1}$, $H_{b2}$, $T_{a1}$, $T_{a2}$, $T_{b1}$, and $T_{b2}$ may be the same as those dimensions of the same labels shown in FIG. 5. It is noted that the heights $H_{a1}$ and $H_{a2}$ are measured from the bottom of the dielectric layer 136a and the heights $H_{b1}$ and $H_{b2}$ are measured from the bottom of the dielectric layer 136b in this embodiment. Other aspects of the device 100 in this embodiment are the same as those in FIGS. 1-4, and are omitted for the purpose of brevity.

Figure 22:
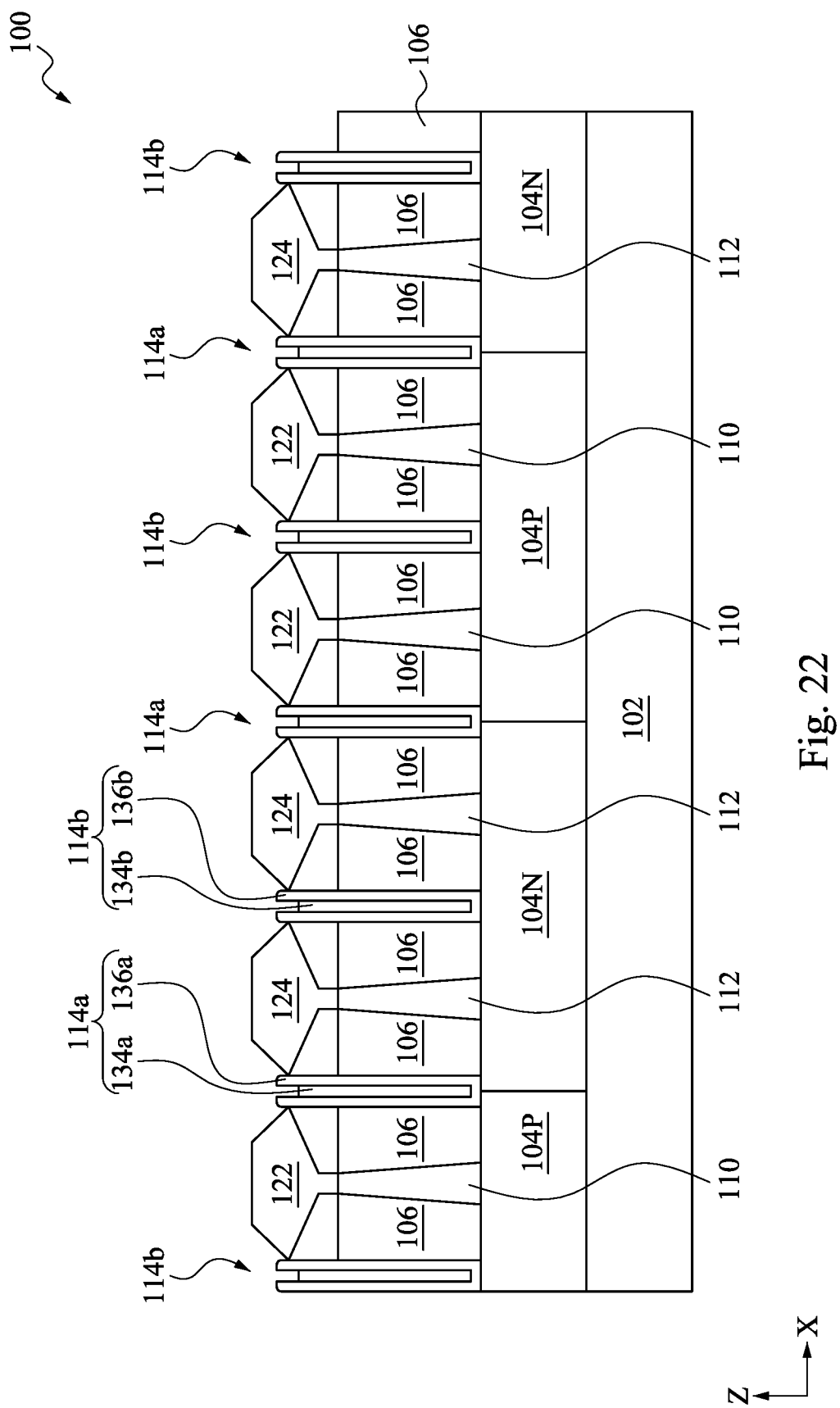
FIG. 22 is a cross-sectional view of the portion of the semiconductor device in FIG. 1 along the B-B line of FIG. 1, according to some embodiments of the present disclosure.

FIG. 22 illustrates a cross-sectional view of the device 100 of another embodiment, along the B-B line of FIG. 1 or FIG. 2. The device 100 in this embodiment is the same as the device 100 shown in FIG. 6 except that the dielectric layers 136a and 136b are the outer layers of the MDL fins 114a and 114b respectively and the dielectric layers 134a and 134b are the inner layers of the MDL fins 114a and 114b respectively. The S/D epitaxial features 122 and 124 are grown to maximum or near-maximum volume. In some instances, the S/D epitaxial features 122 and 124 come into direct contact with the dielectric layers 136a and 136b.

Figure 23:
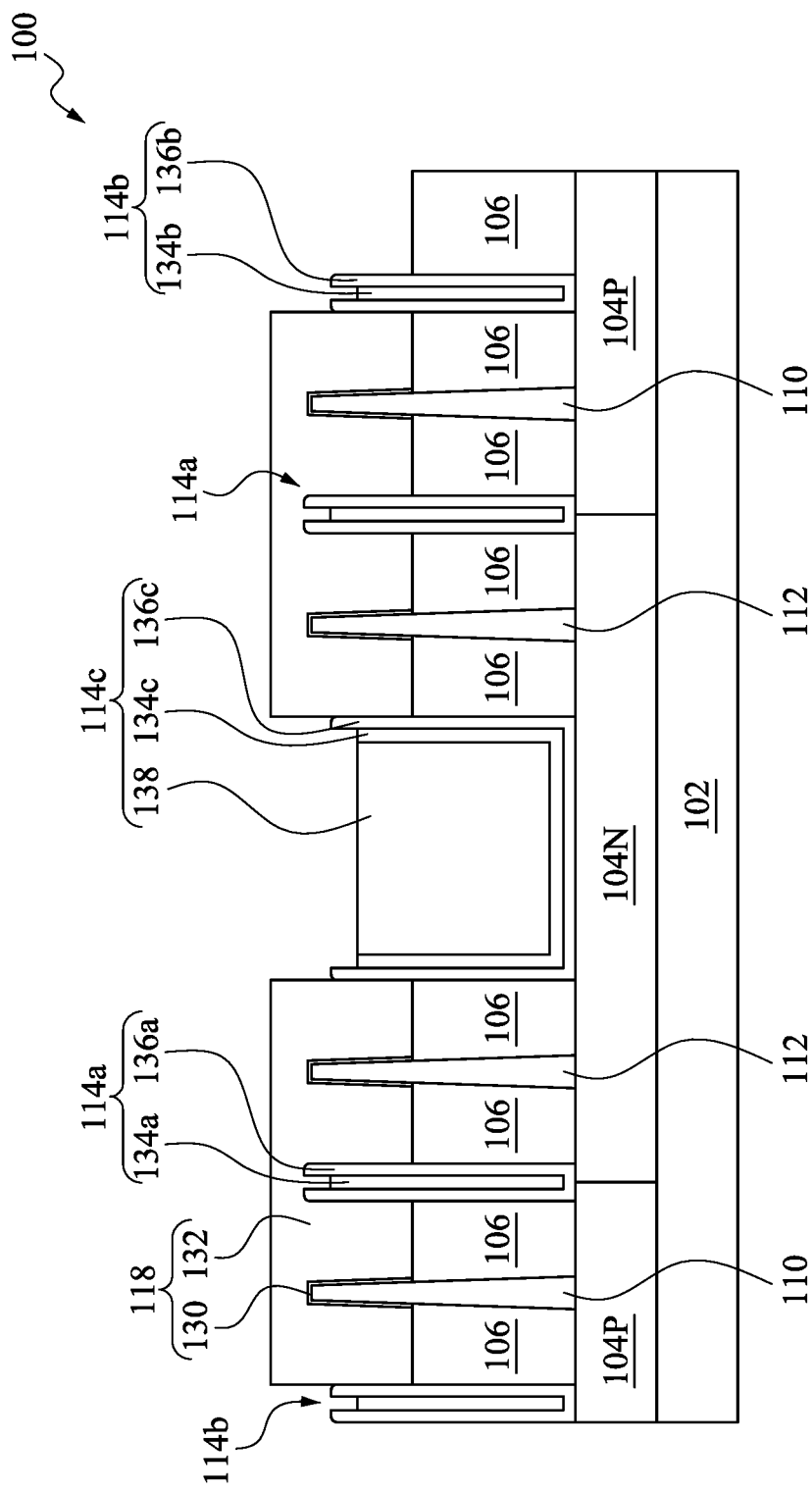
FIGS. 23 and 24 are cross-sectional views of the portion of the semiconductor device in FIG. 7 along the C-C and D-D lines of FIG. 7, respectively, according to some embodiments of the present disclosure.
Figure 24:
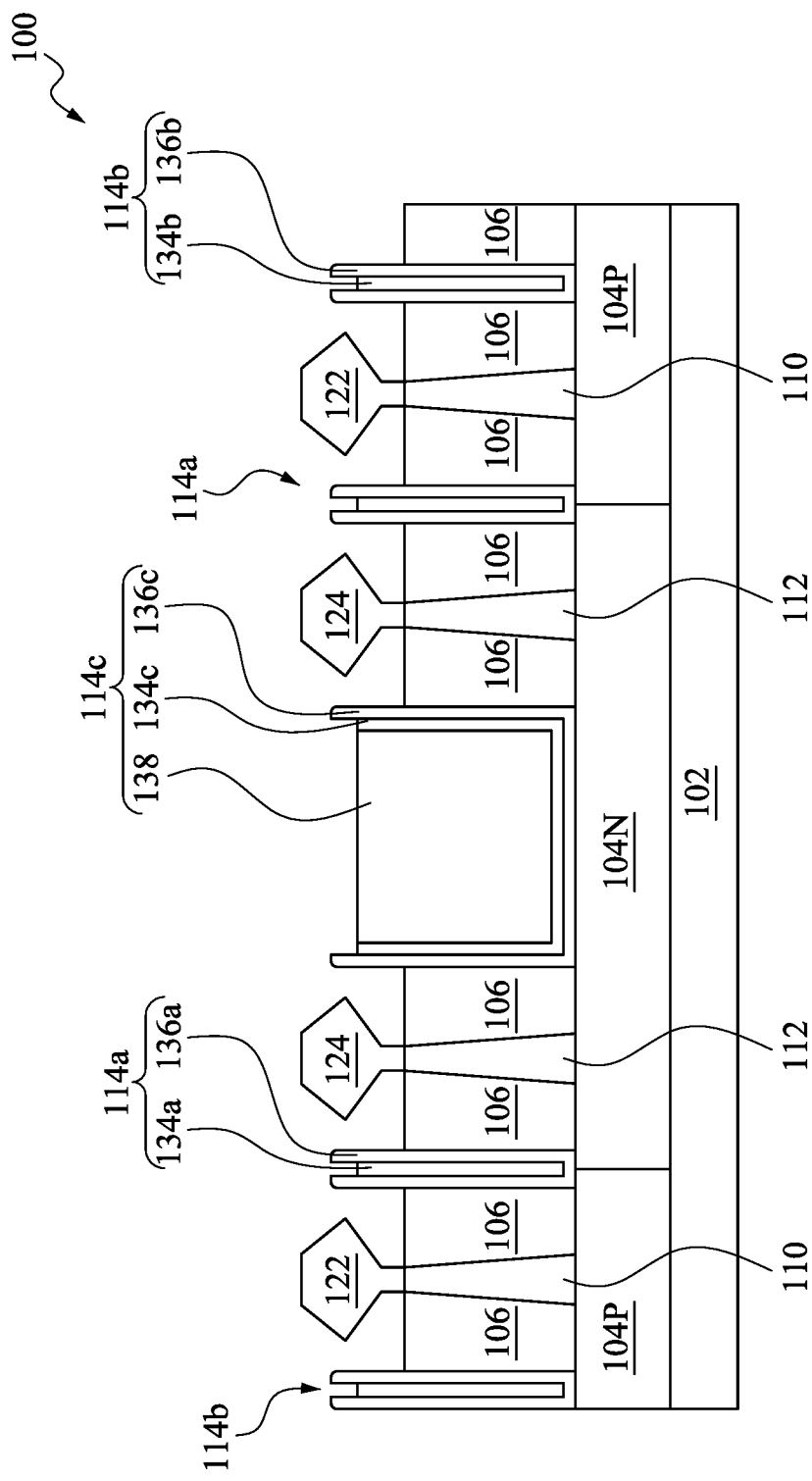

FIGS. 23 and 24 illustrate cross-sectional views of the device 100 of another embodiment, along the C-C line and the D-D line of FIG. 7. The device 100 in this embodiment is the same as the device 100 shown in FIGS. 7-9 with the following differences. The dielectric layers 136a, 136b, and 136c are the outer layers of the MDL fins 114a, 114b, and 114c respectively. The dielectric layers 134a, 134b, and 134c are disposed over the dielectric layers 136a, 136b, and 136c respectively. The dielectric layer 138 is disposed over the dielectric layer 134c in the MDL fin 114c. The top surfaces of the dielectric layers 134c and 138 are about the same, which is lower than the top surface of the dielectric layer 136c.

Figure 25:
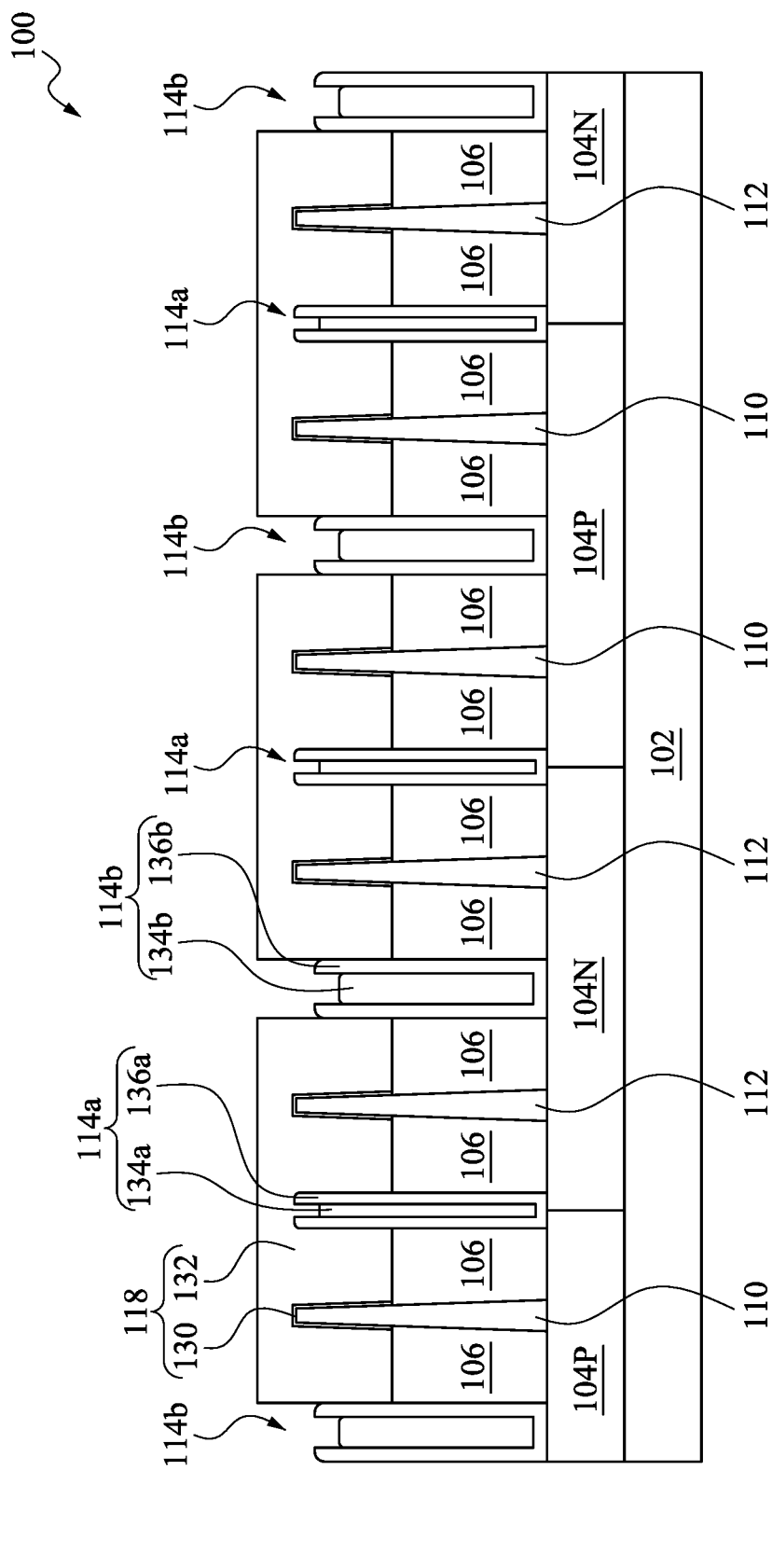
FIGS. 25 and 26 are cross-sectional views of the portion of the semiconductor device in FIG. 1 along the A-A line of FIG. 1, according to some embodiments of the present disclosure.

FIG. 25 illustrates a cross-sectional view of the device 100 of another embodiment, along the A-A line of FIG. 1. The device 100 of this embodiment is the same as the device 100 shown in FIG. 10 except that the dielectric layers 136a and 136b are the outer layers of the MDL fins 114a and 114b respectively and the dielectric layers 134a and 134b are the inner layers of the MDL fins 114a and 114b respectively. The MDL fins 114b are wider than the MDL fins 114a along the X direction. For example, the dielectric layer 134b may be wider than the dielectric layer 134a along the X direction, for example, by about 20%, while the dielectric layers 136a and 136b may have substantially the same width.

Figure 26:
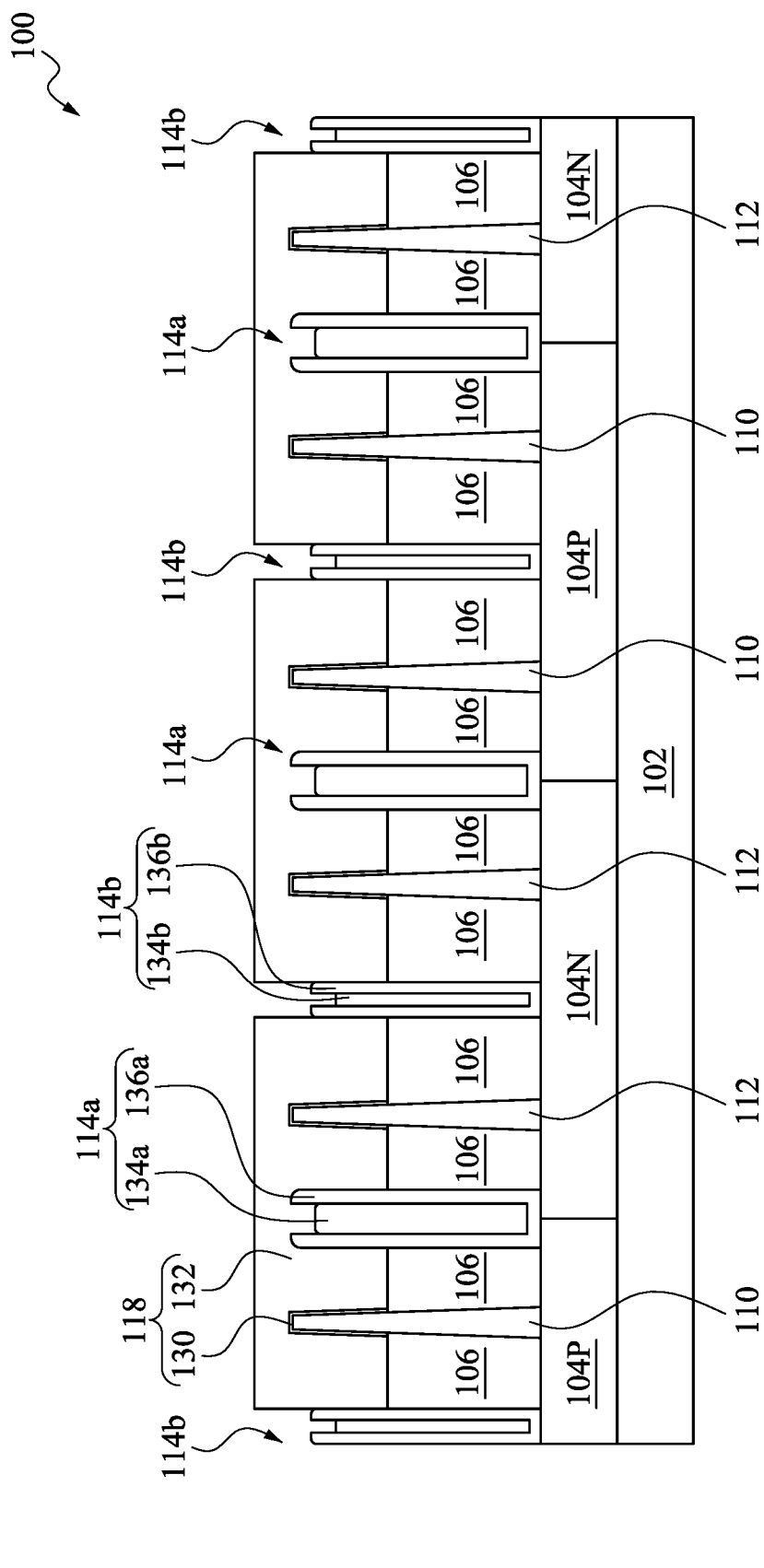

FIG. 26 illustrates a cross-sectional view of the device 100 of another embodiment, along the A-A line of FIG. 1. The device 100 of this embodiment is the same as the device 100 shown in FIG. 11 except that the dielectric layers 136a and 136b are the outer layers of the MDL fins 114a and 114b respectively and the dielectric layers 134a and 134b are the inner layers of the MDL fins 114a and 114b respectively. The MDL fins 114a are wider than the MDL fins 114b along the X direction. For example, the dielectric layer 134a may be wider than the dielectric layer 134b along the X direction, for example, by about 20%, while the dielectric layers 136a and 136b may have substantially the same width.

Figure 27:
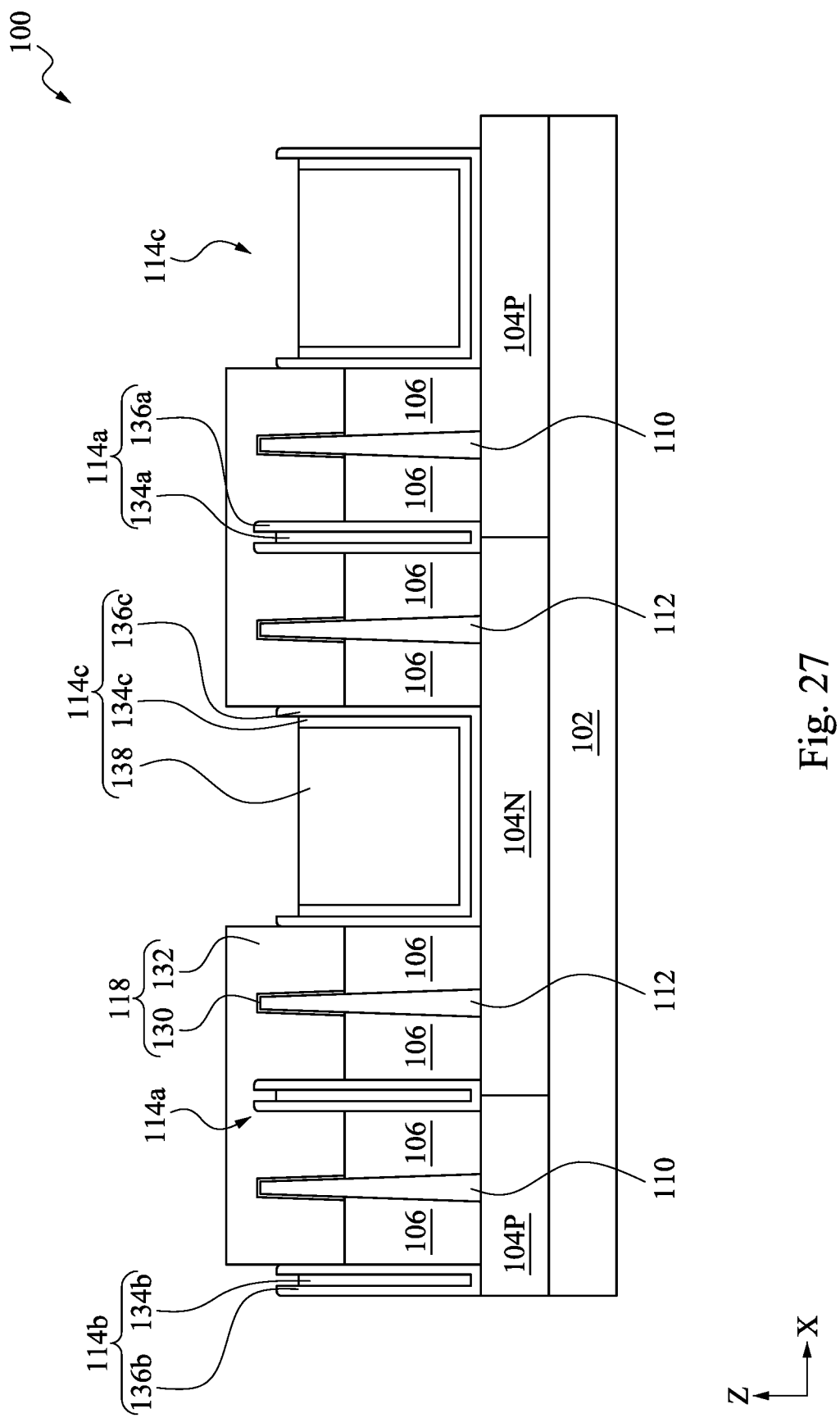
FIG. 27 is a cross-sectional view of the portion of the semiconductor device in FIG. 12 along the E-E line of FIG. 12, according to some embodiments of the present disclosure.

FIG. 27 illustrates a cross-sectional view of the device 100 of another embodiment, along the E-E line of FIG. 12. The device 100 of this embodiment is the same as the device 100 shown in FIG. 13 except the following differences. In this embodiment, the dielectric layers 136a, 136b, and 136c are the outer layers of the MDL fins 114a, 114b, and 114c respectively. The dielectric layers 134a, 134b, and 134c are disposed over the dielectric layers 136a, 136b, and 136c respectively. The dielectric layer 138 is disposed over the dielectric layer 134c in the MDL fins 114c. The top surfaces of the dielectric layers 134c and 138 are about the same, which is lower than the top surface of the dielectric layer 136c.

Figure 28:
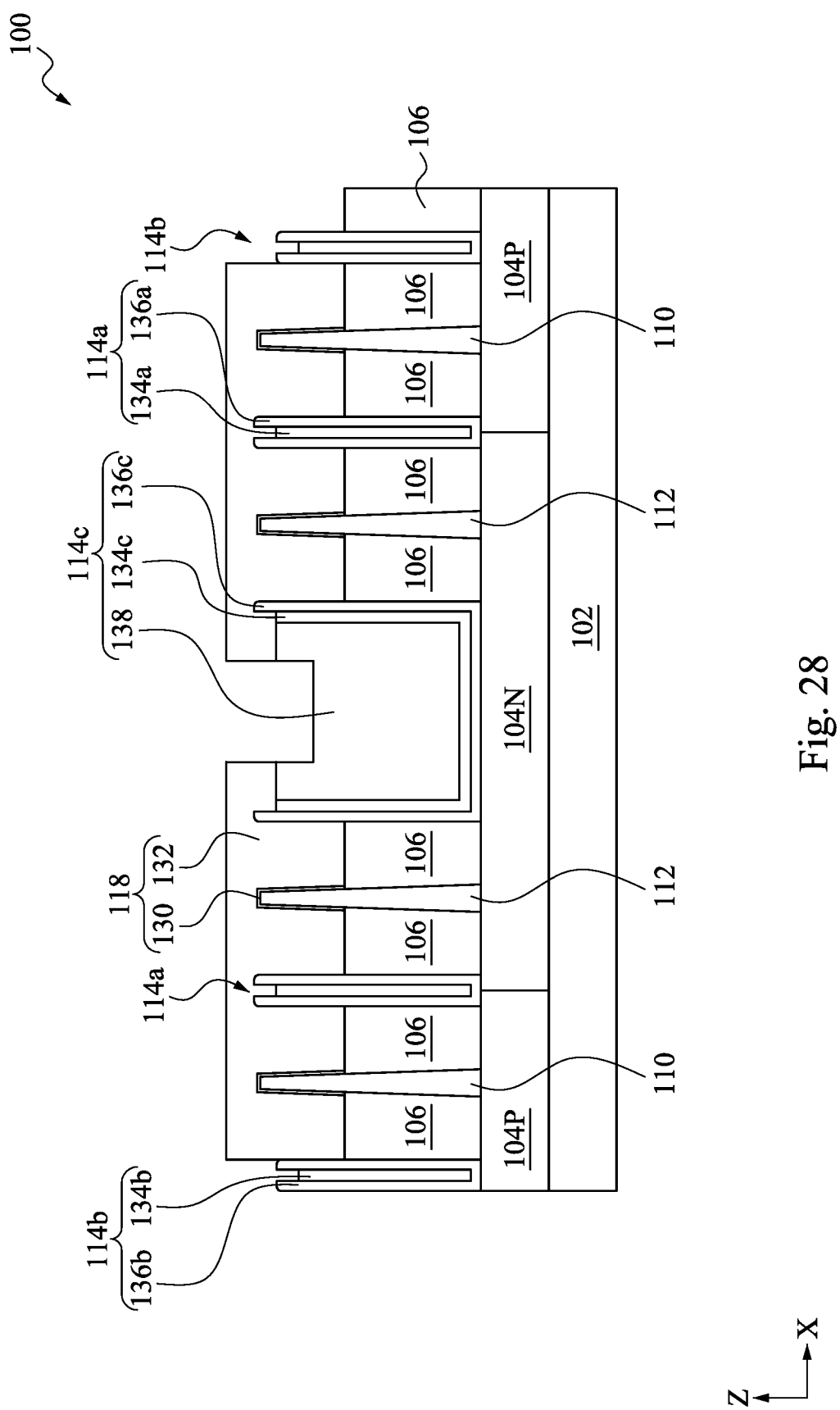
FIG. 28 is a cross-sectional view of the portion of the semiconductor device in FIG. 7 along the G-G line of FIG. 15, according to some embodiments of the present disclosure.

FIG. 28 illustrates a cross-sectional view of the device 100 of another embodiment, along the G-G line of FIG. 15. The device 100 of this embodiment is the same as the device 100 shown in FIG. 16 except the following differences. In this embodiment, the dielectric layers 136a, 136b, and 136c are the outer layers of the MDL fins 114a, 114b, and 114c respectively. The dielectric layers 134a, 134b, and 134c are disposed over the dielectric layers 136a, 136b, and 136c respectively. The dielectric layer 138 is disposed over the dielectric layer 134c in the MDL fins 114c. The top surfaces of the dielectric layers 134c and 138 are about the same, which is lower than the top surface of the dielectric layer 136c.

Figure 29:
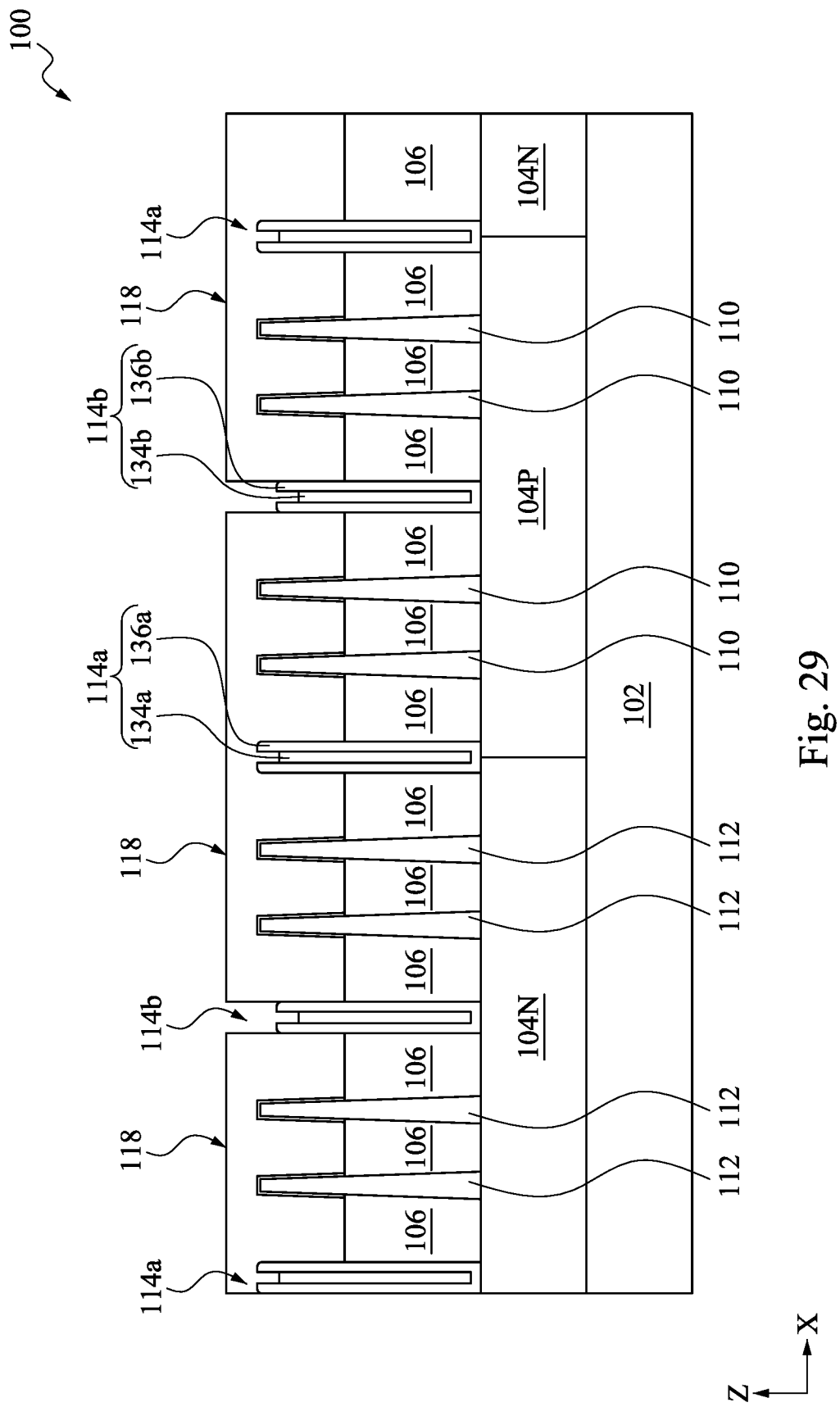
FIGS. 29 and 30 are cross-sectional views of a portion of a semiconductor device, according to some embodiments of the present disclosure.
Figure 30:
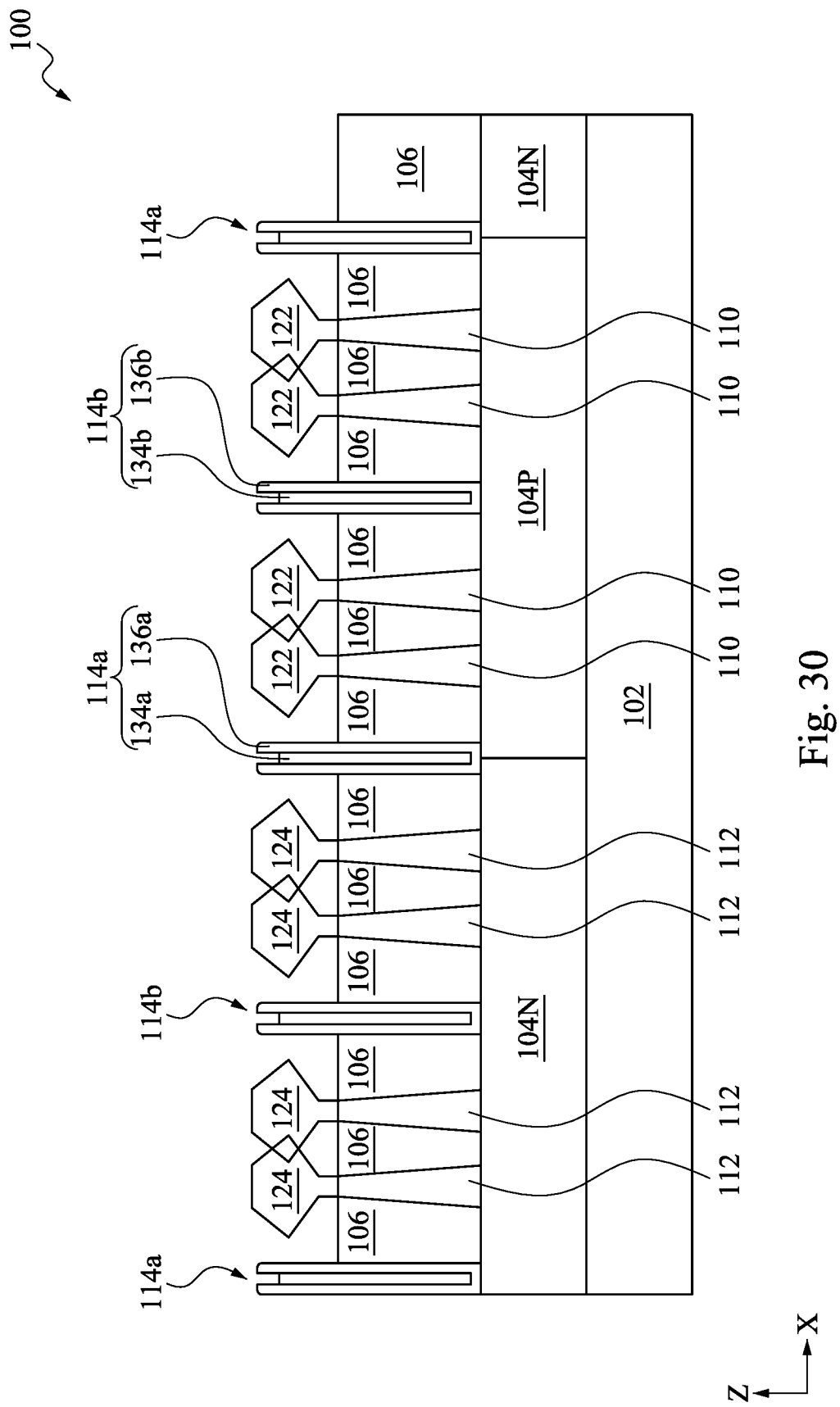

FIG. 29 illustrates a cross-sectional view of the device 100 according to another embodiment, cut along the length of the gate structures 118. FIG. 30 illustrates a cross-sectional view of the device 100 of this embodiment, cut into the S/D area. The device 100 in this embodiment is substantially the same as the device 100 shown in FIGS. 17 and 18 except that the dielectric layers 136a and 136b are the outer layers of the MDL fins 114a and 114b respectively and the dielectric layers 134a and 134b are the inner layers of the MDL fins 114a and 114b respectively.

Although not intended to be limiting, one or more embodiments of the present disclosure provide many benefits to a semiconductor device. For example, embodiments of the present disclosure provide multi-dielectric-layer (MDL) fins as dummy fins inserted between active semiconductor fins for improving fin density uniformity and for isolating adjacent semiconductor fins and adjacent gate structures. Each of the MDL fins includes a lower-dielectric-constant layer and a higher-dielectric-constant layer. The lower-dielectric-constant layer helps reduce coupling capacitance between adjacent gate structures. The higher-dielectric-constant layer provides high etch resistivity during etching processes, thereby providing high dummy fins for isolating nearby S/D epitaxial features. Due to the presence of the MDL fins, the S/D epitaxial features can be grown to maximum or near-maximum volume, which increases strain to the channel and increases S/D contact landing area for reduced S/D contact resistance.

In one exemplary aspect, the present disclosure is directed to a semiconductor device. The semiconductor device includes a substrate; semiconductor fins over the substrate and oriented lengthwise along a first direction; first multi-dielectric-layer (MDL) fins and second MDL fins over the substrate and oriented lengthwise along the first direction; and gate structures oriented lengthwise along a second direction generally perpendicular to the first direction. The first and the second MDL fins are intermixed with the semiconductor fins. Each of the first MDL fins and the second MDL fins includes an outer dielectric layer and an inner dielectric layer. The outer dielectric layer and the inner dielectric layer have different dielectric materials. The gate structures are spaced from each other along the first direction, and are separated by the first MDL fins along the second direction. The gate structures engage the semiconductor fins and the second MDL fins.

In an embodiment of the semiconductor device, the outer dielectric layer of the second MDL fins is taller than the outer dielectric layer of the first MDL fins. In another embodiment, the inner dielectric layer of the second MDL fins is taller than the inner dielectric layer of the first MDL fins.

In an embodiment, a dielectric material of the outer dielectric layer of the first and the second MDL fins has a lower dielectric constant than a dielectric material of the inner dielectric layer of the first and the second MDL fins. In a further embodiment, the dielectric material of the outer dielectric layer of the first and the second MDL fins has a dielectric constant equal to or less than 5, and the dielectric material of the inner dielectric layer of the first and the second MDL fins has a dielectric constant equal to or greater than 7. In another further embodiment, a top surface of the inner dielectric layer of the first MDL fins is higher than a top surface of the outer dielectric layer of the first MDL fins, and a top surface of the inner dielectric layer of the second MDL fins is higher than a top surface of the outer dielectric layer of the second MDL fins.

In an embodiment, a dielectric material of the outer dielectric layer of the first and the second MDL fins has a higher dielectric constant than a dielectric material of the inner dielectric layer of the first and the second MDL fins. In a further embodiment, the dielectric material of the inner dielectric layer of the first and the second MDL fins has a dielectric constant equal to or less than 5, and the dielectric material of the outer dielectric layer of the first and the second MDL fins has a dielectric constant equal to or greater than 7. In another further embodiment, a top surface of the inner dielectric layer of the first MDL fins is lower than a top surface of the outer dielectric layer of the first MDL fins, and a top surface of the inner dielectric layer of the second MDL fins is lower than a top surface of the outer dielectric layer of the second MDL fins.

In another embodiment, the first MDL fins are wider than the second MDL fins along the second direction. In some embodiments, the first MDL fins include one more dielectric layer than the second MDL fins.

In an embodiment, the semiconductor device further includes a third MDL fin over the substrate and oriented lengthwise along the first direction, wherein the third MDL fin includes one more dielectric layer than the first and the second MDL fins. In another embodiment, the semiconductor device further includes epitaxial S/D features having their widths confined by the adjacent first and second MDL fins along the second direction.

In another exemplary aspect, the present disclosure is directed to a semiconductor device. The semiconductor device includes a substrate; semiconductor fins over the substrate and oriented lengthwise along a first direction; first multi-dielectric-layer (MDL) fins and second MDL fins over the substrate and oriented lengthwise along the first direction; and gate structures oriented lengthwise along a second direction generally perpendicular to the first direction. Some of the semiconductor fins are of N-conductivity type, and some of the semiconductor fins are of P-conductivity type. Each of the first MDL fins is positioned between two of the semiconductor fins that are of a same conductivity type, and each of the second MDL fins is positioned between two of the semiconductor fins that are of opposite conductivity types. Each of the first MDL fins and the second MDL fins includes an outer dielectric layer and an inner dielectric layer, wherein the outer dielectric layer includes a first dielectric material, and the inner dielectric layer includes a second dielectric material that has a different dielectric constant than the first dielectric material. The gate structures are spaced from each other along the first direction, and are separated by the first MDL fins along the second direction, wherein the gate structures engage the semiconductor fins and the second MDL fins.

In an embodiment of the semiconductor device, the first dielectric material has a dielectric constant equal to or less than 5, and the second dielectric material has a dielectric constant equal to or greater than 7. In an embodiment, the second dielectric material has a dielectric constant equal to or less than 5, and the first dielectric material has a dielectric constant equal to or greater than 7. In yet another embodiment, the first MDL fins and the second MDL fins are placed alternatingly along the second direction, and there is only one semiconductor fin between two adjacent first and second MDL fins. In yet another embodiment, the first MDL fins and the second MDL fins are placed alternatingly along the second direction, wherein two or more semiconductor fins of a same conductivity type are positioned between two adjacent first and second MDL fins.

In yet another exemplary aspect, the present disclosure is directed to a semiconductor device that includes a substrate and CMOS cells formed over the substrate. Each CMOS cell includes an N-conductivity type semiconductor fin and a P-conductivity type semiconductor fin oriented lengthwise along a first direction and further includes a first multi-dielectric-layer (MDL) fin oriented lengthwise along the first direction and positioned between the N-conductivity type and the P-conductivity type semiconductor fins. Each CMOS cell further includes a gate structure engaging the N-conductivity type and the P-conductivity type semiconductor fins and the first MDL fin. The semiconductor device further includes second MDL fins over the substrate, oriented lengthwise along the first direction, and positioned between the CMOS cells. Each of the first MDL fins and the second MDL fins includes an outer dielectric layer and an inner dielectric layer. The outer dielectric layer includes a first dielectric material, and the inner dielectric layer includes a second dielectric material that has a different dielectric constant than the first dielectric material.

In an embodiment of the semiconductor device, the first dielectric material has a dielectric constant equal to or less than 5, and the second dielectric material has a dielectric constant equal to or greater than 7.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   an isolation structure directly on the substrate;
   a first fin and a second fin extending vertically from the substrate to extend through the isolation structure, and lengthwise along a first direction;
   a first epitaxial feature disposed on the first fin;
   a second epitaxial feature disposed on the second fin; and
   a dielectric fin disposed between the first fin and the second fin as well as between the first epitaxial feature and the second epitaxial feature along a second direction perpendicular to the first direction, wherein the dielectric fin comprises:
      an outer dielectric layer formed of a first dielectric material, and
      an inner dielectric layer formed of a second dielectric material different from the first dielectric material,
   wherein the dielectric fin extending vertically from the substrate to extend through the isolation structure,
   wherein the inner dielectric layer is spaced apart from the isolation structure by the outer dielectric layer,
   wherein a top surface of the inner dielectric layer is higher than a top surface of the outer dielectric layer.

2. The semiconductor structure of claim 1, wherein the first epitaxial feature and the second epitaxial feature are in direct contact with the inner dielectric layer.

3. The semiconductor structure of claim 2, wherein the first epitaxial feature and the second epitaxial feature are spaced apart from the outer dielectric layer.

4. The semiconductor structure of claim 1, wherein a dielectric constant of the first dielectric material is smaller than a dielectric constant of the second dielectric material.

5. The semiconductor structure of claim 1,
   wherein the first dielectric material comprises silicon oxide, silicon oxycarbide, silicon oxycarbide nitride, or silicon oxynitride,
   wherein the second dielectric material comprises hafnium oxide, tantalum oxide, titanium oxide, zirconium oxide, aluminum oxide, or yttrium oxide.

6. The semiconductor structure of claim 1, wherein the first fin and the second fin comprise semiconductor materials.

7. The semiconductor structure of claim 1, further comprising:
   an n-type well region and a p-type well region abutting the n-type well region at an interface extending along the first direction,
   wherein the first fin is disposed over the n-type well region,
   wherein the second fin is disposed over the p-type well region,
   wherein the dielectric fin is disposed directly over the interface.

8. The semiconductor structure of claim 1, wherein the outer dielectric layer extends between a bottom surface of the inner dielectric layer and a top surface of the substrate.

9. A semiconductor structure, comprising:
   an isolation structure;
   a first dielectric fin and a second dielectric fin extending vertically through the isolation structure and lengthwise along a first direction, each of the first dielectric fin and the second dielectric fin comprising:
      an outer dielectric layer formed of a first dielectric material, and
      an inner dielectric layer formed of a second dielectric material different from the first dielectric material; and
   a source/drain feature disposed between the first dielectric fin and the second dielectric fin along a second direction perpendicular to the first direction,
   wherein the inner dielectric layer is spaced apart from the isolation structure by the outer dielectric layer,
   wherein a top surface of the inner dielectric layer is lower than a top surface of the outer dielectric layer.

10. The semiconductor structure of claim 9, wherein the source/drain feature is in direct contact with the inner dielectric layer.

11. The semiconductor structure of claim 9, wherein the source/drain feature is spaced apart from the outer dielectric layer.

12. The semiconductor structure of claim 9, wherein a dielectric constant of the first dielectric material is smaller than a dielectric constant of the second dielectric material.

13. The semiconductor structure of claim 9,
   wherein the first dielectric material comprises silicon oxide, silicon oxycarbide, silicon oxycarbide nitride, or silicon oxynitride,
   wherein the second dielectric material comprises hafnium oxide, tantalum oxide, titanium oxide, zirconium oxide, aluminum oxide, or yttrium oxide.

14. The semiconductor structure of claim 9, further comprising:
   a semiconductor fin extending along the first direction and between the first dielectric fin and the second dielectric fin,
   wherein the source/drain feature is disposed directly on the semiconductor fin.

15. The semiconductor structure of claim 9,
   wherein the first dielectric fin is disposed over a first well region,
   wherein the second dielectric fin is disposed over an interface between the first well region and a second well region,
   wherein a conductivity type of the first well region is different from a conductivity type of the second well region.

16. A semiconductor structure, comprising:
   a first well region and a second well region abutting the first well region at an interface extending along a first direction;
   an isolation structure disposed directly on the first well region and the second well region;
   a first dielectric fin disposed directly over the interface and extending vertically through the isolation structure, the first dielectric fin comprising:
      a first outer dielectric layer formed of a first dielectric material, and
      a first inner dielectric layer formed of a second dielectric material different from the first dielectric material;
   a second dielectric fin disposed over the second well region and extending vertically through the isolation structure, the second dielectric fin comprising:
      a second outer dielectric layer formed of the first dielectric material,
      a second inner dielectric layer formed of a third dielectric material, and
      a middle dielectric layer sandwiched between the second outer dielectric layer and the second inner dielectric layer, the middle dielectric layer being formed of the second dielectric material; and a source/drain feature disposed between the first dielectric fin and the second dielectric fin along a second direction perpendicular to the first direction, wherein, along the second direction, the middle dielectric layer is spaced apart from the isolation structure by the second outer dielectric layer.

17. The semiconductor structure of claim 16, wherein a composition of the third dielectric material is the same as a composition of the first dielectric material.

18. The semiconductor structure of claim 16, wherein a top surface of the middle dielectric layer is higher than a top surface of the second outer dielectric layer or a top surface of the second inner dielectric layer.

19. The semiconductor structure of claim 16, wherein a dielectric constant of the second dielectric material is greater than a dielectric constant of the first dielectric material or a dielectric constant of the third dielectric material.

20. The semiconductor structure of claim 16, wherein a width of the second dielectric fin along the second direction is greater than a width of the first dielectric fin along the second direction.

\* \* \* \* \*